US011985870B2

(12) United States Patent
Yokoyama et al.

(10) Patent No.: US 11,985,870 B2
(45) Date of Patent: May 14, 2024

(54) DISPLAY DEVICE

(71) Applicant: SHARP KABUSHIKI KAISHA, Sakai (JP)

(72) Inventors: Makoto Yokoyama, Sakai (JP); Junichi Yamada, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 835 days.

(21) Appl. No.: 17/042,877

(22) PCT Filed: Mar. 30, 2018

(86) PCT No.: PCT/JP2018/013993
§ 371 (c)(1),
(2) Date: Sep. 28, 2020

(87) PCT Pub. No.: WO2019/187159
PCT Pub. Date: Oct. 3, 2019

(65) Prior Publication Data
US 2021/0028270 A1 Jan. 28, 2021

(51) Int. Cl.
| H01L 51/52 | (2006.01) |
| G09G 3/32 | (2016.01) |
| H01L 27/32 | (2006.01) |
| H01L 51/00 | (2006.01) |
| H01L 51/56 | (2006.01) |
| H10K 59/131 | (2023.01) |
| H10K 77/10 | (2023.01) |

(52) U.S. Cl.
CPC ............. *H10K 59/131* (2023.02); *G09G 3/32* (2013.01); *H10K 77/10* (2023.02)

(58) Field of Classification Search
CPC ............. H10K 59/121; H10K 59/1213; H10K 59/1216; H10K 59/84; H10K 59/131; G09G 2300/0426; G09G 2310/0232
See application file for complete search history.

(56) References Cited

U.S. PATENT DOCUMENTS

| 9,853,096 B1* | 12/2017 | Choi ................... H10K 59/131 |
| 2012/0112988 A1 | 5/2012 | Nakanishi et al. |
| 2015/0070616 A1 | 3/2015 | Ogasawara et al. |
| 2016/0190166 A1 | 6/2016 | Kim et al. |
| 2016/0329350 A1 | 11/2016 | Na et al. |
| 2017/0287992 A1 | 10/2017 | Kwak et al. |
| 2018/0158417 A1 | 6/2018 | Xiang et al. |
| 2019/0250478 A1 | 8/2019 | Horiuchi et al. |
| 2019/0331974 A1 | 10/2019 | Furuta et al. |

FOREIGN PATENT DOCUMENTS

| CN | 107481669 A | 12/2017 |
| CN | 107561806 A | 1/2018 |
| CN | 107749247 A | 3/2018 |

(Continued)

*Primary Examiner* — John A Bodnar
(74) *Attorney, Agent, or Firm* — ScienBiziP, P.C.

(57) ABSTRACT

A nick is disposed in a display region so as to partly cut the display region. A first routed wire is routed from the display region toward the nick. The first routed wire is included in a first metal layer. A first conductive film is included in a second metal layer. The first routed wire and the first conductive film overlap each other via an inorganic insulating film.

20 Claims, 17 Drawing Sheets

(56) References Cited

FOREIGN PATENT DOCUMENTS

| | | |
|---|---|---|
| JP | 2012-103335 A | 5/2012 |
| JP | 2016-167093 A | 9/2016 |
| WO | 2018/012455 A1 | 1/2018 |
| WO | 2018/030207 A1 | 2/2018 |

* cited by examiner (a)

(b)

(c)

DISPLAY DEVICE

TECHNICAL FIELD

The disclosure relates to a display device.

BACKGROUND ART

Patent Literature 1 discloses a technique of preventing brightness unevenness in a display portion having a peculiar shape (i.e., the corner of the display portion is cut).

CITATION LIST

Patent Literature

Patent Literature 1: Japanese Patent Application Laid-Open No. 2012-103335 (published on May 31, 2012).

SUMMARY OF INVENTION

Technical Problem

The conventional technique involves a display portion of particular limited shape.

Solution to Problem

A display device according to one aspect of the disclosure includes a display region and a frame region disposed around the display region. The display region includes a nick provided so as to partly cut the display region. The display region includes the following: a plurality of data signal lines that transmit a data signal; a plurality of scan signal lines intersecting with the plurality of data signal lines; a plurality of light-emission control lines; and a plurality of sub-pixel circuits provided so as to correspond to points of intersection between the plurality of data signal lines and the plurality of scan signal lines. The display device also includes the following: a drive circuit electrically connected to the plurality of data signal lines; a drive circuit electrically connected to the plurality of scan signal lines; and a drive circuit electrically connected to the plurality of light-emission control lines. The frame region on the periphery of the nick includes a first routed wire electrically connected to one of the plurality of scan signal lines, one of the plurality of light-emission control lines, or one of the plurality of data signal lines. The first routed wire extends from the display region toward the nick. The first routed wire is included in a first metal layer. The display device also includes a first conductive film included in a second metal layer. The first routed wire and the first conductive film overlap each other via an inorganic insulating film.

Advantageous Effect of Disclosure

The aspect of the disclosure improves brightness unevenness in a display portion having a nick.

DESCRIPTION OF EMBODIMENTS

The wording "in the same layer" hereinafter refers to that one layer is formed in the same process step (film formation step) as another thing. The wording "in a lower position than" hereinafter refers to that one layer is formed in a process step anterior to a process step of forming the comparative layer. The wording "in a higher position than" hereinafter refers to that one layer is formed in a process step posterior to a process step of forming the comparative layer.

Figure 1:
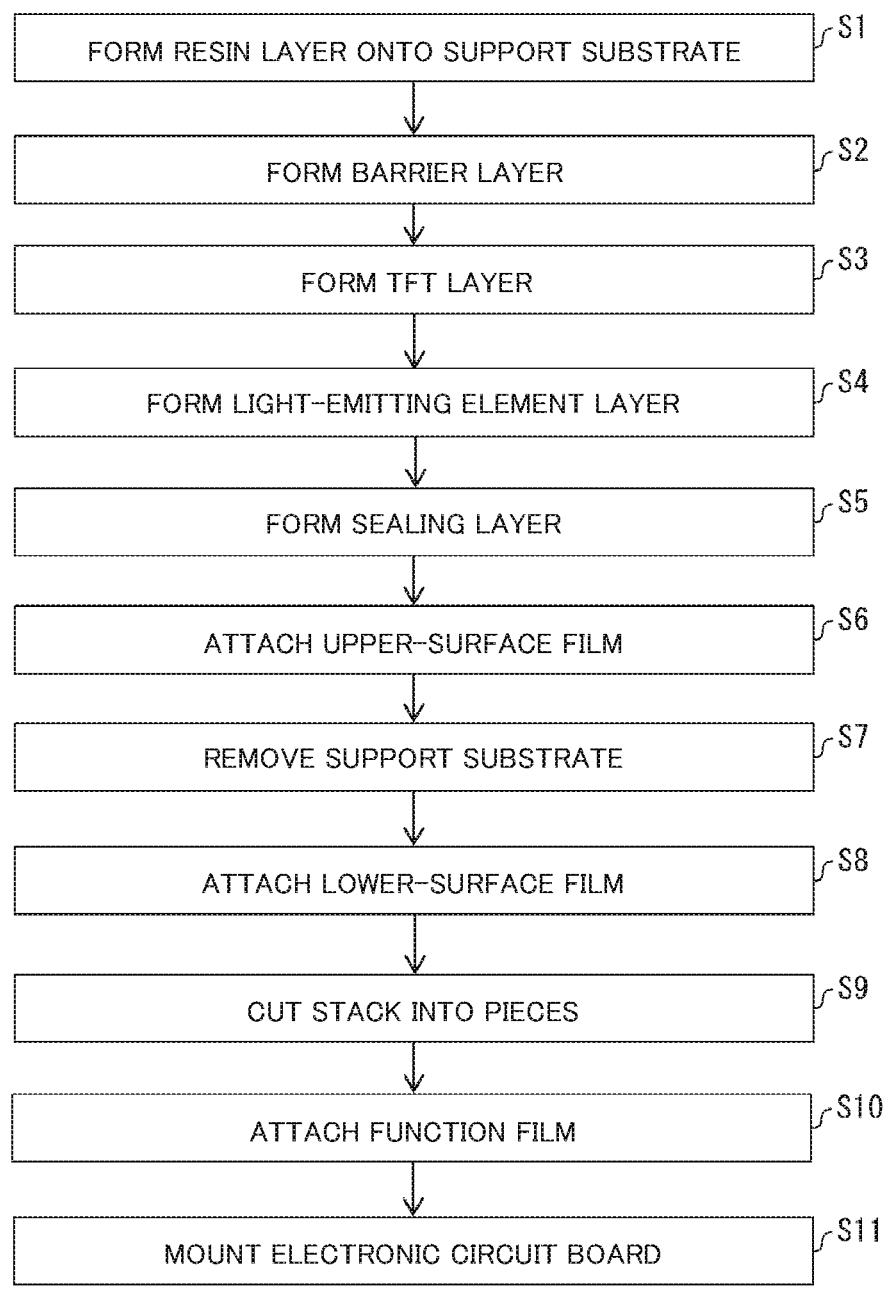
FIG. 1 is a flowchart illustrating, by way of example only, how to produce a display device.

FIG. 1 is a flowchart illustrating, by way of example only, how to produce a display device. FIG. 2(a) is a cross-sectional view of an example configuration of a display portion of the display device. FIG. 2(b) is a flowchart illustrating, by way of example only, process steps for forming a TFT layer.

A method of producing a flexible display device includes the following process steps in sequence: Step S1 of forming a resin layer 12 onto a translucent support substrate (e.g., a mother glass substrate); Step 2 of forming a barrier layer 3; Step S3 of forming a TFT layer 4; Step S4 of forming a top-emission light-emitting-element layer 5; Step S5 of forming a sealing layer 6; and Step S6 of attaching an upper-surface film to the sealing layer 6.

The method also includes the following process steps in sequence: Step S7 of removing the support substrate from the resin layer 12 by laser light irradiation or other methods; Step S8 of attaching a lower-surface film 10 to the lower surface of the resin layer 12; Step S9 of cutting a stack of the lower film 10, resin layer 12, barrier layer 3, TFT layer 4, light-emitting-element layer 5, and sealing layer 6 into a plurality of pieces; Step S10 of attaching a function film 39 to the resultant pieces; and Step S11 of mounting an electronic circuit board (e.g., an IC chip and an FPC) onto a part (a terminal) of a region (a non-display region or a frame) that is outside a display region having a plurality of sub-pixels. Steps S1 to S11 are performed by an apparatus that produces the display device (including a film formation apparatus that performs Steps S1 to S5).

The resin layer 12 is made of, but not limited to, polyimide. The resin layer 12 can be replaced with a set of two resin films (e.g., polyimide films) and an inorganic insulating film sandwiched between these resin films.

The barrier layer 3 prevents foreign substances, such as water and oxygen, from entering the TFT layer 4 and the light-emitting-element layer 5. The barrier layer 3 can be composed of a silicon oxide film, a silicon nitride film, or a silicon oxide nitride film, all of which are formed through CVD, or can be composed of a stack of these layers.

The TFT layer 4 includes the following components: a semiconductor film 15, an inorganic insulating film 16 (a gate insulating film) in a higher position than the semiconductor film 15; a gate electrode GE and gate line GH in a higher position than the inorganic insulating film 16; an inorganic insulating film 18 in a higher position than the gate electrode GE and the gate wire GH; a capacitor electrode CE in a higher position than the inorganic insulating film 18; an inorganic insulating film 20 in a higher position than the capacitor electrode CE; a source wire SH in a higher position than the inorganic insulating film 20; and a flattening film 21 (an interlayer insulating film) in a higher position than the source wire SH.

The semiconductor film 15 is made of, but not limited to, low-temperature polysilicon (LTPS) or oxide semiconductor (e.g., In—Ga—Zn—O semiconductor). Together with the gate electrode GE, the semiconductor film 15 forms a transistor (herein a TFT). Although the transistor has a top-gate structure in FIG. 2, it may have a bottom-gate structure.

The gate electrode GE, gate wire GH, capacitor electrode CE, and source wire SH are each composed of a monolayer film of metal including at least one of, for instance, aluminum, tungsten, molybdenum, tantalum, chromium, titanium, and copper; alternatively these components are each composed of a laminated films of these materials. The TFT layer 4 includes one semiconductor layer and three metal layers (i.e., first, second, and third metal layers), as illustrated in FIG. 2(b).

The inorganic insulating films 16, 18, and 20 each can be composed of a silicon oxide (SiOx) film or a silicon nitride (SiNx) film, both of which are formed through CVD, or each can be composed of a laminated layers of these films. The flattening film 21 can made of organic material that can be applied, such as polyimide or acrylic.

The light-emitting-element layer 5 includes the following components: an anode 22 in a higher position than the flattening film 21; an edge cover 23 that is insulating and covering the edge of the anode 22; an electroluminescence (EL) layer 24 in a higher position than the edge cover 23; and a cathode 25 in a higher position than the EL layer 24. The edge cover 23 contains an organic material (such as polyimide or acrylic) patterned through photolithography after application.

Each sub-pixel includes, in the light-emitting-element layer 5, a light-emitting element ES (e.g., an organic light-emitting diode or OLED for short, and a quantum-dot light-emitting diode or QLED for short) that includes the island-shaped anode 22, island-shaped EL layer 24, and island-shaped cathode 25. The light-emitting element ES is controlled by a control circuit disposed in the TFT layer 4. The light-emitting element and the control circuit constitute a sub-pixel circuit.

The EL layer 24 is composed of, but not limited to, a set of a hole injection layer, hole transport layer, light-emitting layer, electron transport layer, and electron injection layer sequentially stacked from below. The light-emitting layer is provided in the form of islands in the openings of the edge cover 23 (i.e., for each sub-pixel) through a vapor deposition method or an ink-jet method. The other layers are provided either in the form of islands or in a flat manner (i.e., in a common layer). One or more of the hole injection layer, hole transport layer, hole transport layer, and electron injection layer can be omitted.

Forming a light-emitting layer of an OLED uses a fine metal mask (FMM). The FMM is a sheet (made of Invar for instance) having many openings, through one of which an organic substance passes, thus forming an island-shaped light-emitting layer (corresponding to a single sub-pixel).

Forming a light-emitting layer of a QLED uses ink-jet application of a solvent containing diffused quantum dots, for instance, thus forming an island-shaped light-emitting layer (corresponding to a single sub-pixel).

For instance, the anode 22 is composed of a stack of indium tin oxide (ITO) and silver (Ag) or is composed of a stack of ITO and Ag-containing alloy. The anode 22 reflects light. The cathode 25 can be composed of a translucent conductor, such as a MgAg alloy (extremely thin film), an ITO, or an indium zinc oxide (IZO).

When the light-emitting element ES is an OLED, a drive current between the anode 22 and cathode 25 rejoins holes and electrons within the light-emitting layer, thus generating excitons. These excitons emit light in the process of transition to a ground state. The cathode 25 is translucent, and the anode 22 is right-reflective. The light from the EL layer 24 hence travels upward and goes out from the top.

When the light-emitting element ES is a QLED, a drive current between the anode 22 and cathode 25 rejoin holes and electrons in the light-emitting layer, thus generating excitons. These excitons emit light (fluorescent light) in the process of transition from a conduction band level of the quantum dots to a valence band level of the quantum dots.

The light-emitting-element layer 5 may include light-emitting elements other than OLEDs and QLEDs as described above (e.g., inorganic light-emitting diodes).

The sealing layer 6 is translucent. The sealing layer 6 includes an inorganic sealing film 26 covering the cathode 25, an organic buffer film 27 in a higher position than the inorganic sealing film 26, and an inorganic sealing film 28 in a higher position than the organic buffer film 27. The sealing layer 6, which covers the light-emitting-element layer 5, prevents foreign substances (including water and oxygen) from penetrating the light-emitting-element layer 5.

Each of the inorganic sealing films 26 and 28 is an inorganic insulating film. Each of the inorganic sealing film 26 and 28 can be composed of a silicon oxide film, a silicon nitride film, or a silicon oxide nitride film, all of which are formed through CVD, or can be composed of a stack of these films. The organic buffer film 27 is a translucent organic film that flattens a film, and can be made of organic material that can be applied, such as acrylic. The organic buffer film 27 can be formed through ink-jet application for instance; in some embodiments, the non-display region may have a bank for stopping ink droplets.

The lower film 10 is, but not limited to, a PET film attached to the lower surface of the resin layer 12 after the removal of the support substrate, thus achieving a highly flexible display device. For instance, the function film 39 serves as at least one of an optical compensator, a touch sensor, and a protector.

The foregoing has described a flexible display device. Producing a non-flexible display device, which typically requires no formation of a resin layer and no replacement of a base, involves Steps S2 to S5 of stacking layers onto a glass substrate, followed by Step S9 for instance.

First Embodiment

Figure 3:
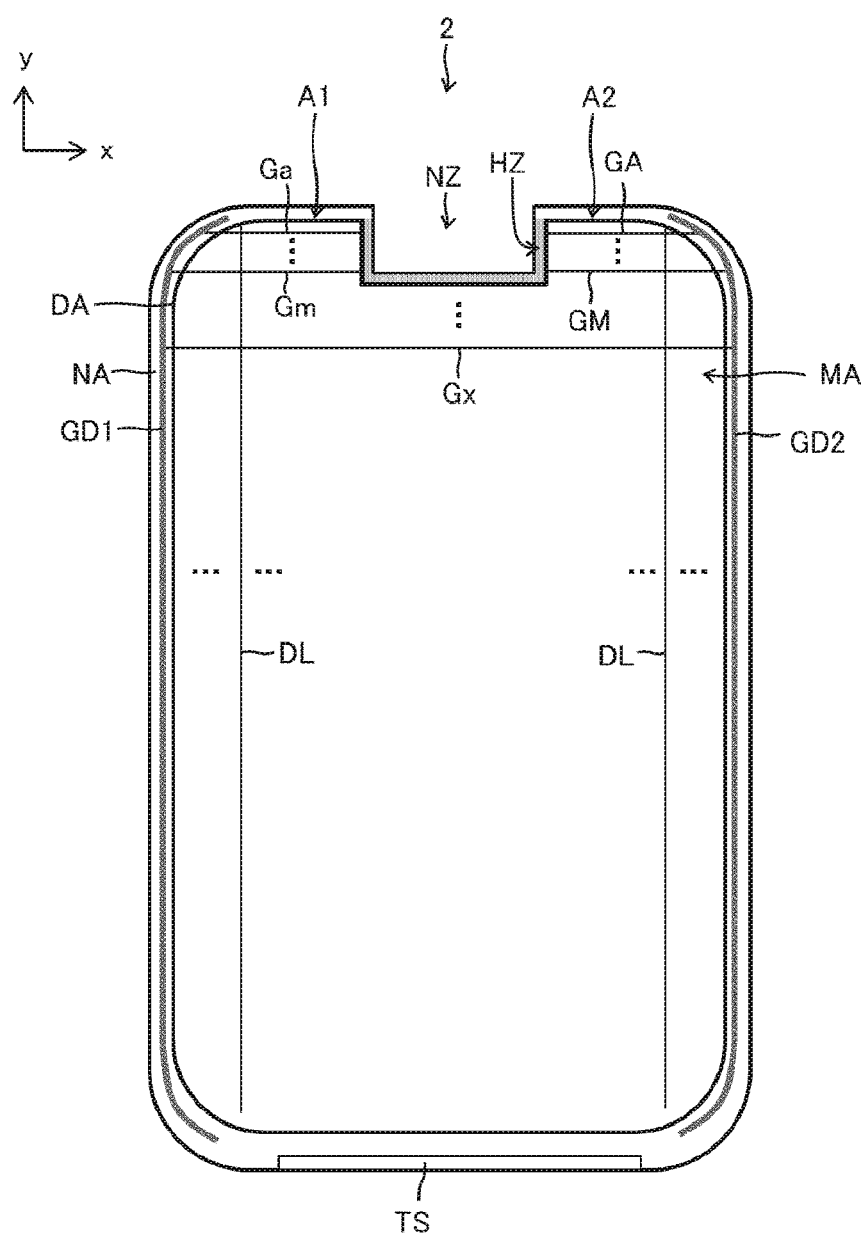
FIG. 3 is a plan view of the configuration of a display device according to a first embodiment.
Figure 4:
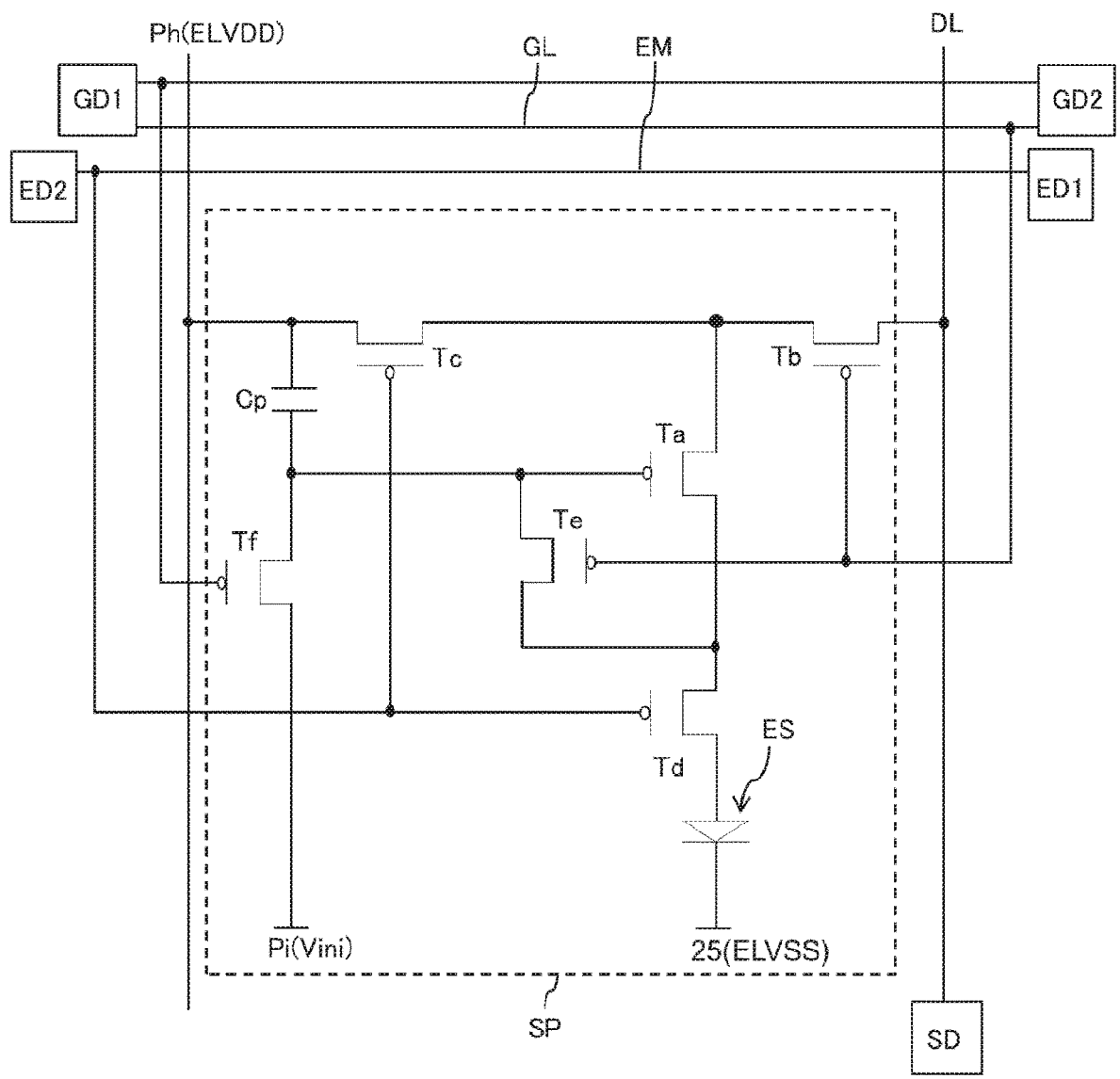
FIG. 4 is a circuit diagram illustrating an example configuration of a sub-pixel circuit included in a display region.

FIG. 3 is a plan view of the configuration of a display device according to a first embodiment. FIG. 4 is a circuit diagram illustrating an example configuration of a sub-pixel circuit included in a display region. FIG. 3 illustrates a display device 2 that includes a display region DA including sub-pixels, and a frame region (non-display region) NA around the display region DA. The display region DA has a nick (e.g., a notch for placing lens and a sensor) NZ. Disposed in the display region DA are sub-pixels SP including the light-emitting elements ES. Each sub-pixel SP is connected to a data signal line DL, a scan signal line Gx, a light-emission control line EM, a high-voltage power-source line Ph, and an initialization power-source line Pi. The sub-pixel SP includes a capacitor Cp having one electrode connected to the high-voltage power-source line Ph, and the other electrode connected to a gate terminal of a drive transistor Ta. The drive transistor Ta has the gate terminal connected to the scan signal line Gx, a source terminal connected to the data signal line DL via a write transistor Tb, and a drain terminal connected to the light-emitting element ES via a transistor Td. The data signal line DL is connected to a source driver SDR; the scan signal line Gx, to gate drivers GD1 and GD2; and the light-emission control line EM, to emission drivers ED1 and ED2. The gate drivers GD1 and GD2 and the emission drives ED1 and ED2 are monolithic in the TFT layer 4 included in the frame region NA.

The following description respectively abbreviates first to eleventh routed wires w1 to w1 as routed wires w to w11. The following description also respectively abbreviates first to fifth conductive films K1 to K5 as conductive films K1 to K5.

The display device 2 has, in the display region DA, a first region A1 and a second region A2 on both sides of the nick NZ. The display device 2 also has the following lines: scan signal lines Ga and Gm extending in the x-direction and passing through the first region A1; scan signal lines GA and GM extending in the x-direction and passing through the second region A2; and the scan signal line Gx extending in the x-direction and passing through a main region MA that is closer to the middle of the display region DA than the nick NZ is.

The data signal line DL, which extends in the y-direction, interests with the scan signal lines Ga, Gm, and Gx. The scan signal lines Ga and Gm are connected to the gate driver GD1; the scan signal lines GA and GM, to the gate driver GD2; and the scan signal line Gx, to the gate drivers GD1 and GD2. Disposed in the frame region NA is a terminal TS for mounting an external substrate. The display region DA is disposed between the terminal TS and the nick NZ in plan view.

Figure 2:
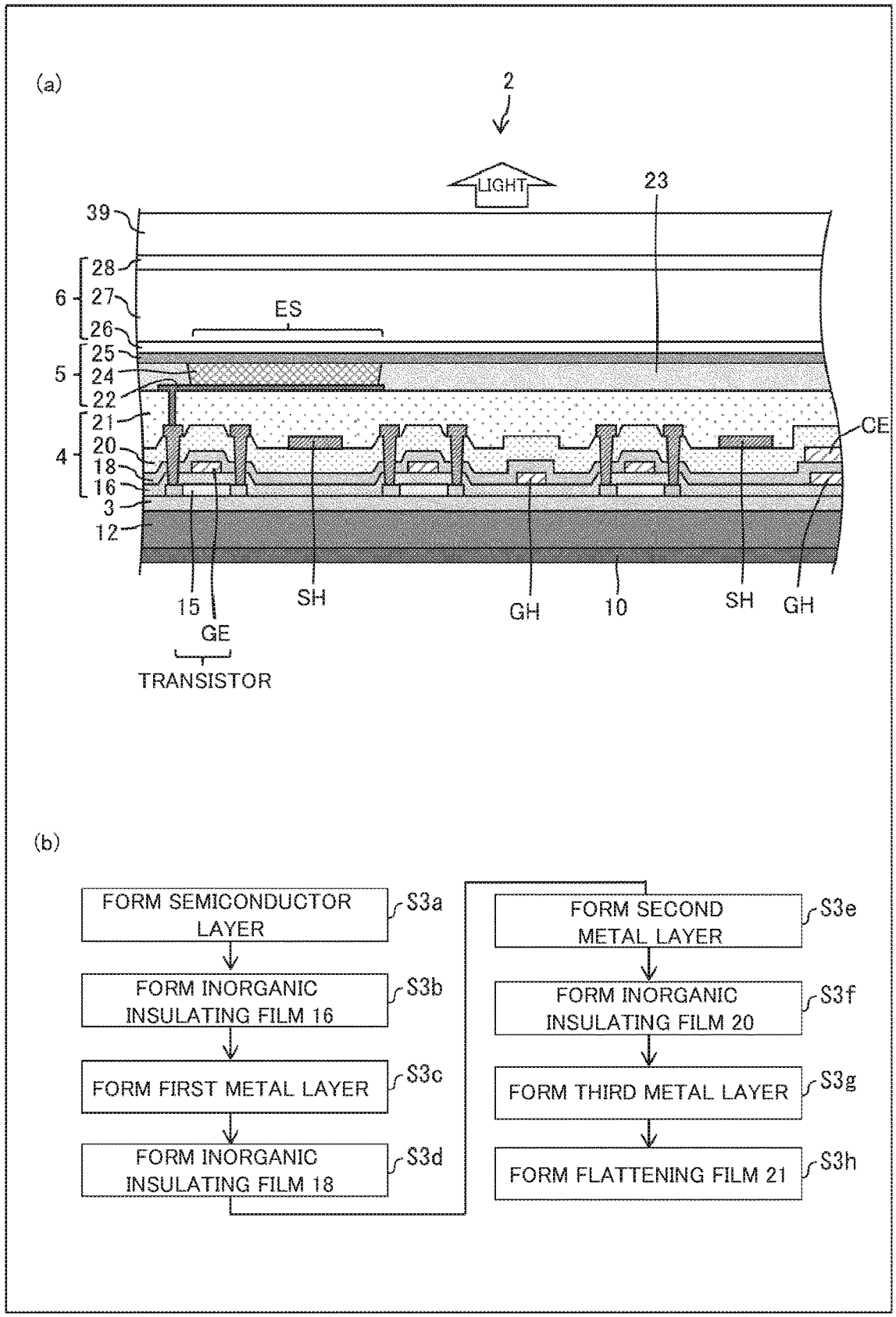
FIG. 2(a) is a cross-sectional view of an example configuration of a display portion of the display device.
FIG. 2(b) is a flowchart illustrating, by way of example only, process steps for forming a TFT layer.
Figure 5:
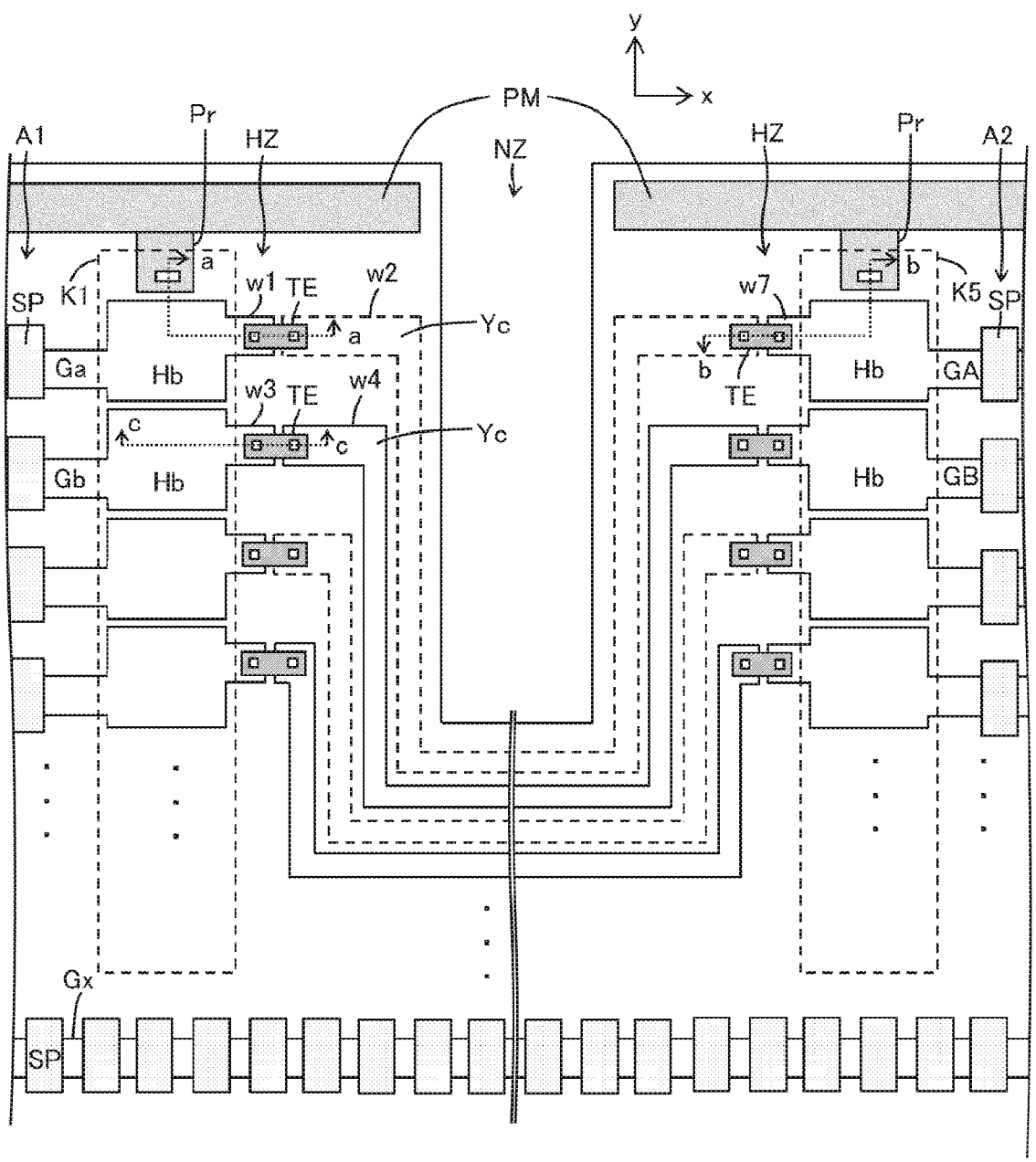
FIG. 5 is a plan view of the configuration around a nick.

FIG. 5 is a plan view of the configuration around the nick. FIG. 6(a) is a cross-sectional view taken along line a-a in FIG. 5. FIG. 6(b) is a cross-sectional view taken along line b-b in FIG. 5. FIG. 6(c) is a cross-sectional view taken along line c-c in FIG. 5. As illustrated in FIG. 2, the TFT layer 4 is formed through the following process steps: Step S3a of forming a semiconductor layer (including the semiconductor film 15 in FIG. 2); Step S3c of forming a first metal layer (including the gate electrode GE and gate wire GH in FIG. 2); Step S3e of forming a second metal layer (including the capacitor electrode CE in FIG. 2); and Step S3g of forming a third metal layer (including the source wire SH in FIG. 2).

Figure 6:
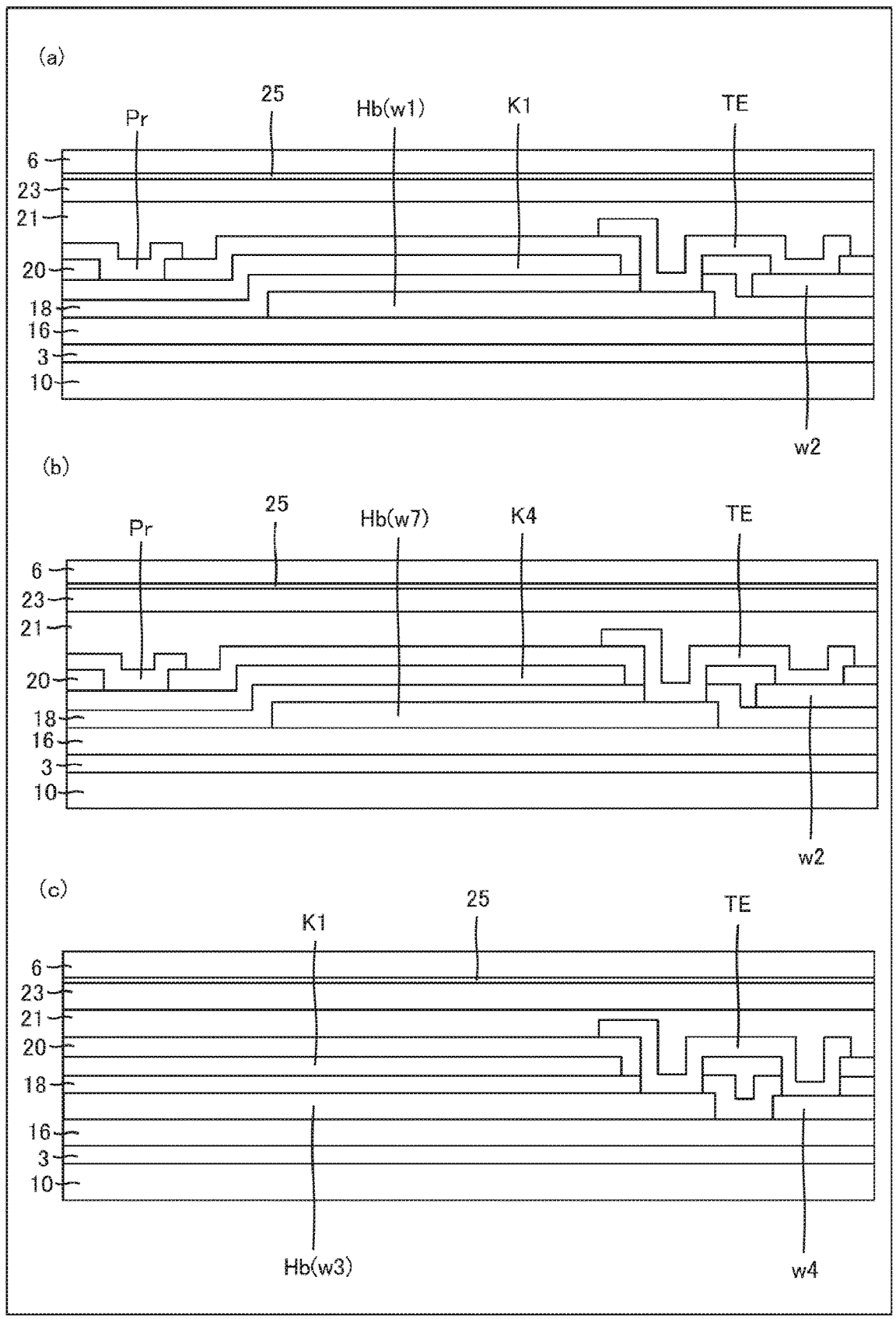
FIG. 6(a) is a cross-sectional view taken along line a-a in FIG. 5.
FIG. 6(b) is a cross-sectional view taken along line b-b in FIG. 5.
FIG. 6(c) is a cross-sectional view taken along line c-c in FIG. 5.

As illustrated in FIGS. 5 and 6, the TFT layer 4 of the display device 2 includes the following wires: the routed wire w1 (included in the first metal layer) routed from the first region A1 toward the nick NZ; the routed wire w3 (included in the first metal layer) routed from the first region A1 toward the nick NZ and adjacent to the routed wire w1; the routed wire w2 (included in the second metal layer) detouring so as to avoid the nick NZ (i.e., passing around the nick NZ); the routed wire w7 (included in the first metal layer) routed from the second region A2 toward the nick NZ; and the routed wire w4 (included in the first metal layer) detouring so as to avoid the nick NZ (i.e., passing around the nick NZ).

The routing wire w2 is connected to the routed wires w1 and w7 via relay electrodes TE (included in the third metal layer). The routed wire w4 is connected to the routed wire w3 via another relay electrode TE. The routed wire w1 extends from the scan signal line Ga (included in the first metal layer); the routed wire w3, from a scan signal line Gb (included in the first metal layer); and the routed wire w7, from the scan signal line GA (included in the first metal layer). The scan signal lines Ga and GA are electrically connected together via the routed wires w1, w2, and w7. The scan signal line Ga is connected to the gate driver GD1 via a routed wire disposed in the frame region NA (outside the edge of the first region A1). The scan signal line GA is connected to the gate driver GD2 via a routed wire disposed in the frame region NA (outside the edge of the second region A2).

As illustrated in FIGS. 5 and 6, disposed in a gap between the first region A1 and the nick NZ is a non-display zone HZ, which forms the perimeter of the first region A1. The conductive film K1 (included in the second metal layer) is disposed in the non-display zone HZ, and overlaps the routed wires w1 and w3 via the inorganic insulating film 18. In addition, disposed in a gap between the second region A2 and the nick NZ is another non-display zone HZ, which forms the perimeter of the second region A2. The conductive film K5 (included in the second metal layer) is disposed in the non-display zone HZ, and overlaps the routed wire w7 via the inorganic insulating film 18. To be specific, the routed wires w1 and w7 individually have their wide portions Hb widening the respective routed wires w1 and w7. The conductive films K1 and K5 overlap the respective wide portions Hb in whole. Each wide portion Hb has an elongated shape larger in the direction of extension (the x-direction) than in the direction of width (the y-direction orthogonal to the x-direction). This shape enables a capacitance between the wide portion Hb and the conductive film K1 to be added to the routed wire w1, and enables a capacitance between the wide portion Hb and the conductive film to be added to the routed wire w7.

The routed wire w2 (included in the second metal layer) has a bend Yc between the display region DA and the nick NZ. The conductive film K1 is disposed between the bend Yc and the display region DA in plan view. Moreover, the routed wire w4 (included in the first metal layer) has a bend Yc between the display region DA and the nick NZ. The conductive film K1 is disposed between the bend Yc and the display region DA in plan view.

Figure 7:
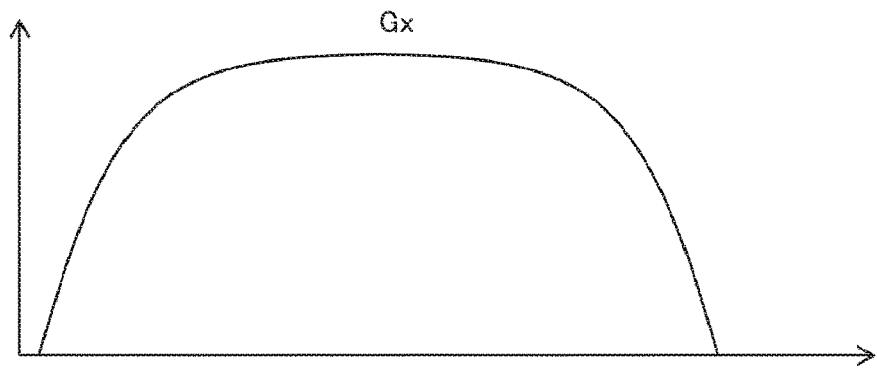
FIG. 7(a) and FIG. 7(b) each schematically illustrate a scan pulse waveform in the first embodiment.
FIG. 7(c) schematically illustrates a scan pulse waveform in a reference example.
Figure 7:
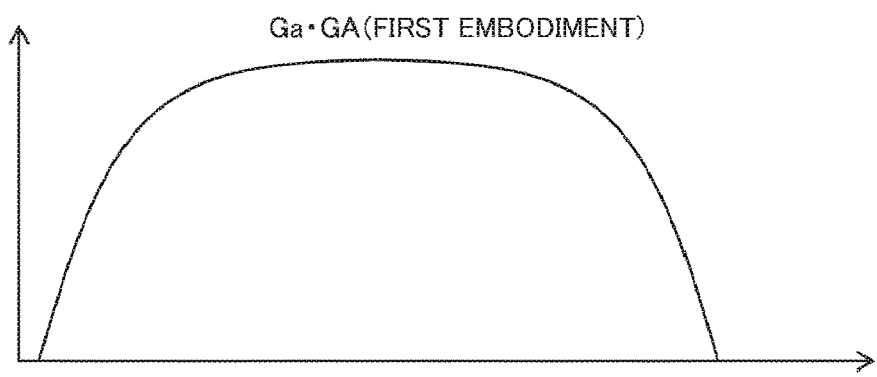
Figure 7:
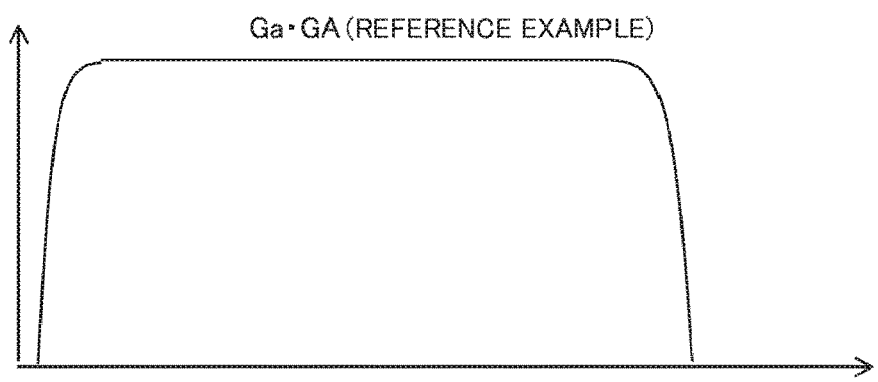

FIG. 7(a) and FIG. 7(b) are schematic diagrams of a scan pulse waveform in the first embodiment. FIG. 7(c) is a schematic diagram of a scan pulse waveform in a reference example. Sub-pixels connected to the scan signal line Ga (passing through the first region A1) and the scan signal line GA (passing through the second region A2) are fewer than sub-pixels connected to the scan signal line Gx, which passes through the main region MA. Hence, for the gate drivers and GD1 and GD2, a drive load of the scan signal lines Ga and GA, electrically connected to the gate drivers GD1 and GD2, is smaller than a drive load of the scan signal line Gx. Capacitance addition to the routed wires w1 and w7, respectively connected to the scan signal lines Ga and GA, can thus reduce the difference between a drive load of the scan signal line Gx and a drive load of the scan signal lines Ga and GA.

This reduction enables a scan pulse in the scan signal line Gx to have rise and fall waveforms, shown in FIG. 7(a), that are coincident with the rise and fall waveforms, shown in FIG. 7(b), of a scan pulse in each of the scan signal lines Ga and GA. Consequently, brightness unevenness is less likely to occur between the first region A1 and second region A2, disposed on both sides of the nick NZ, and the main region MA, closer to the middle of the display region DA than the nick NZ is.

No capacitance addition to the routed wires w1 and w7 (i.e., the absence of the conductive films K1 and K5) causes a signal pulse in each of the scan signal lines Ga and GA to have rise and fall waveforms, shown in FIG. 7(c), that are more abrupt than the rise and fall waveforms of a signal pulse in the scan signal line Gx, shown in FIG. 7(a), thereby possibly causing brightness unevenness.

Although the lines Ga, GA, and Gx are scan signal lines in the foregoing example, these lines may be light-emission control lines (signal lines that supplies a light-emission control pulse to the sub-pixel circuit).

The conductive film K1 in FIGS. 5 and 6 is connected, via a contact hole, to a low-voltage power-source line Pr branched from a low-voltage power-source stem wire PM (included in the third metal layer), and the conductive film K1 receives a low-voltage power source (ELVSS). The low-voltage power source (ELVSS) is supplied to the cathode 25 of the light-emitting element ES. The conductive films K1 and K2 overlap the cathode 25 (a cathode common to the sub-pixel circuits).

In some embodiments, the conductive film K1 may be electrically connected to a high-voltage power-source stem wire, thus receiving a high-voltage power source (ELVDD). The high-voltage power source (ELVDD) is supplied to the capacitor Cp of the sub-pixel circuit in FIG. 4.

Figure 8:
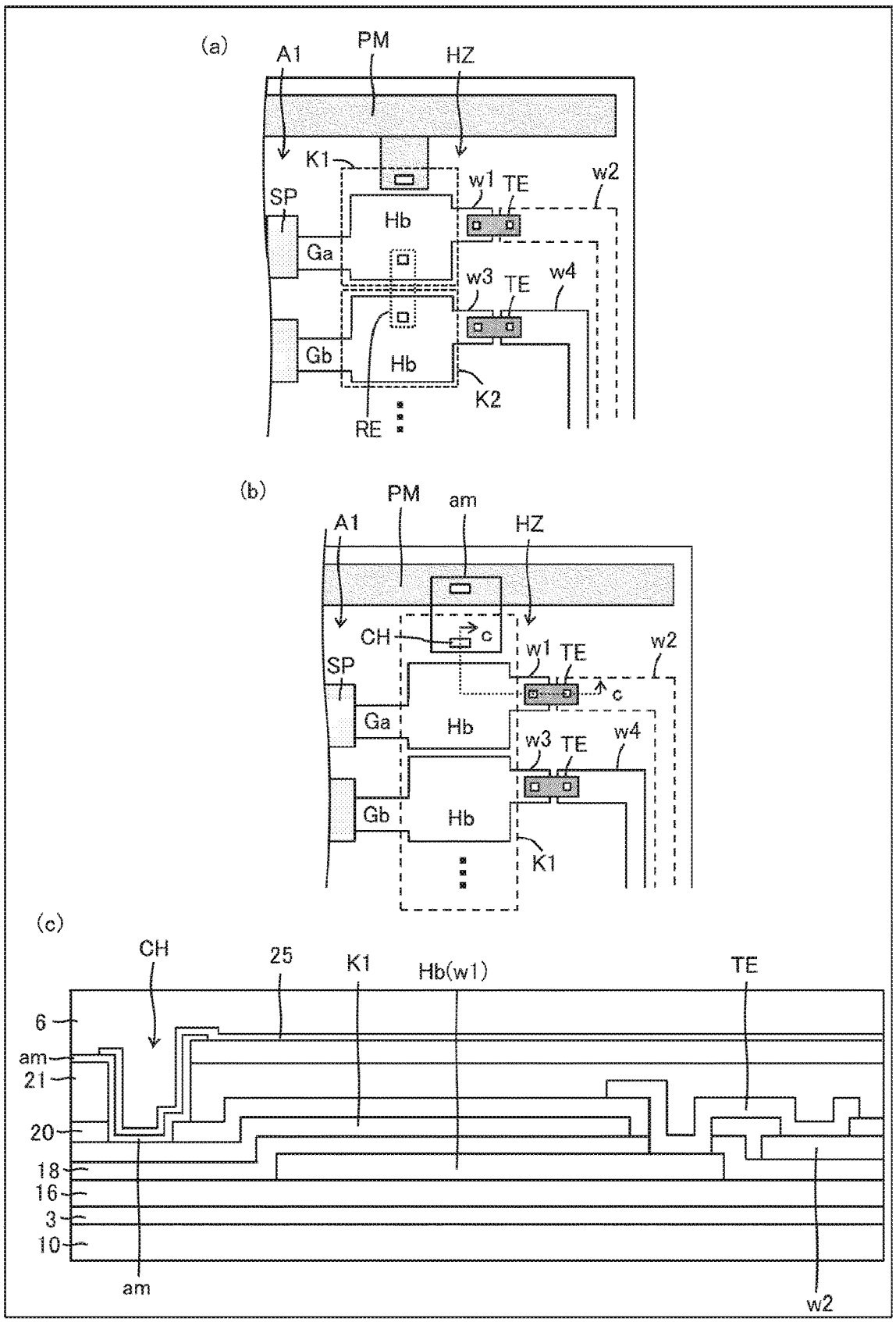
FIG. 8(a) and FIG. 8(b) are plan views of modifications of the configuration around the nick.
FIG. 8(c) is a cross-sectional view taken along line c-c in FIG. 8(b).

FIG. 8(a) and FIG. 8(b) are plan views of modifications of the configuration around the nick. FIG. 8(c) is a cross-sectional view taken along line c-c in FIG. 8(b). As illustrated in FIG. 8(a), the configuration around the nick may be modified in such a manner that the island-shaped conductive film K1, which overlaps the routed wire w1, and the island-shaped conductive film K2, which overlaps the routed wire w3, are provided and are electrically connected together via a wire RE (formed in the same layer as the source wire SH in FIG. 2) included in the third metal layer. In this case, the conductive films K1 and K2 (included in the second metal layer) may be electrically connected together via a wire in the same layer as the second metal layer, a wire in the same layer as the anode 22, or a wire in the same layer as the cathode 25. The conductive films K1 and K2 in FIG. 8(a) cover in whole respective wide portions Hb, thus providing a capacitance value that is less likely to vary, even in occurrence of pattern discrepancy between the first and second metal layers.

As illustrated in FIG. 8(b) and FIG. 8(c), the configuration around the nick may be modified in such a manner that the conductive film K1 within a contact hole CH has an upper surface covered with a metal film am, which is formed in the same layer as the anode 22, and in such a manner that the cathode 25 and the metal film am are in contact with each other within the contact hole CH, thus supplying a low-voltage power-source (ELVSS) to the conductive film K1. The metal film am is herein electrically connected to the low-voltage power-source stem wire PM. The contact hole CH (a trench) extends through the flattening film 21 and the edge cover 23, and is covered with the metal film am in its inside (i.e., the bottom surface and the side wall), thereby stopping water penetration into the display region DA.

Figure 9:
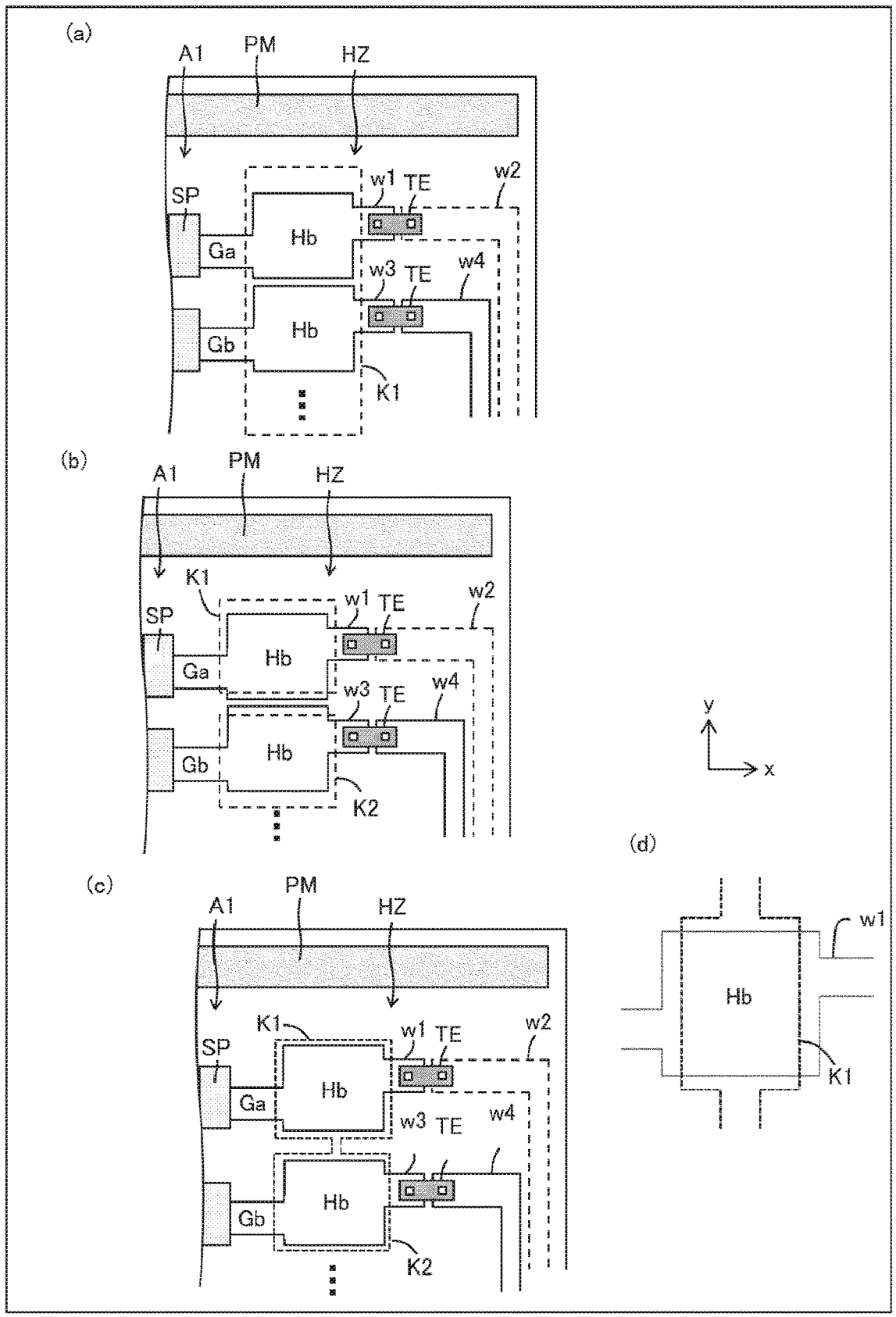
FIG. 9 is a plan view of a further modification of the configuration around the nick.

FIG. 9 is a plan view of a further modification of the configuration around the nick. As illustrated in FIG. 9(a), the conductive film K1 may be electrically floating. The island-shaped conductive film K1, which overlaps the routed wire w1, and the island-shaped conductive film K2, which overlaps the routed wire w3, may be provided and electrically floating. In this case, the conductive films K1 and K2 may be isolated (electrically separated) from each other, as illustrated in FIG. 9(b); alternatively, the conductive films K1 and K2 (included in the second metal layer) may be connected together (electrically connected together) via a wire included in the second metal layer, as illustrated in FIG. 9(c). The conductive films K1 and K2 herein may be electrically connected together via a wire in the same layer as the third metal layer (e.g., the source wire SH), a wire in the same layer as the anode 22, or a wire in the same layer as the cathode 25. The conductive films K1 and K2 in FIG. 9(c) cover in whole respective wide portions Hb, thus providing a capacitance value that is less likely to vary, even in occurrence of pattern discrepancy. FIG. 9(d) illustrates a configuration where the conductive film K1 has two longitudinal sides (parallel in the y-direction) located between the two longitudinal sides of the wide portion Hb, and where the wide portion Hb has two lateral sides (parallel in the x-direction) located between the two lateral sides of the conductive film K1. This configuration can address pattern discrepancy between the first and second metal layers.

Second Embodiment

Figure 10:
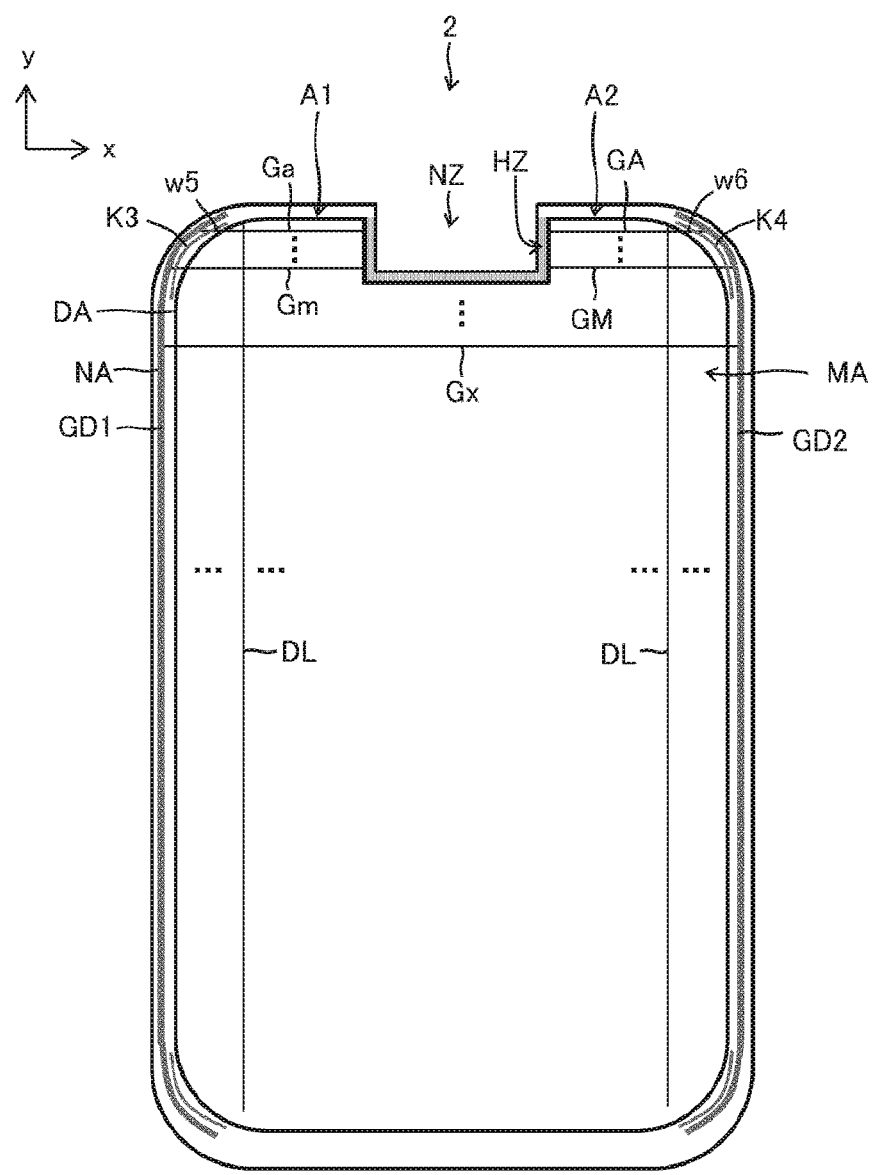
FIG. 10 is a plan view of the configuration of a display device according to a second embodiment.
Figure 11:
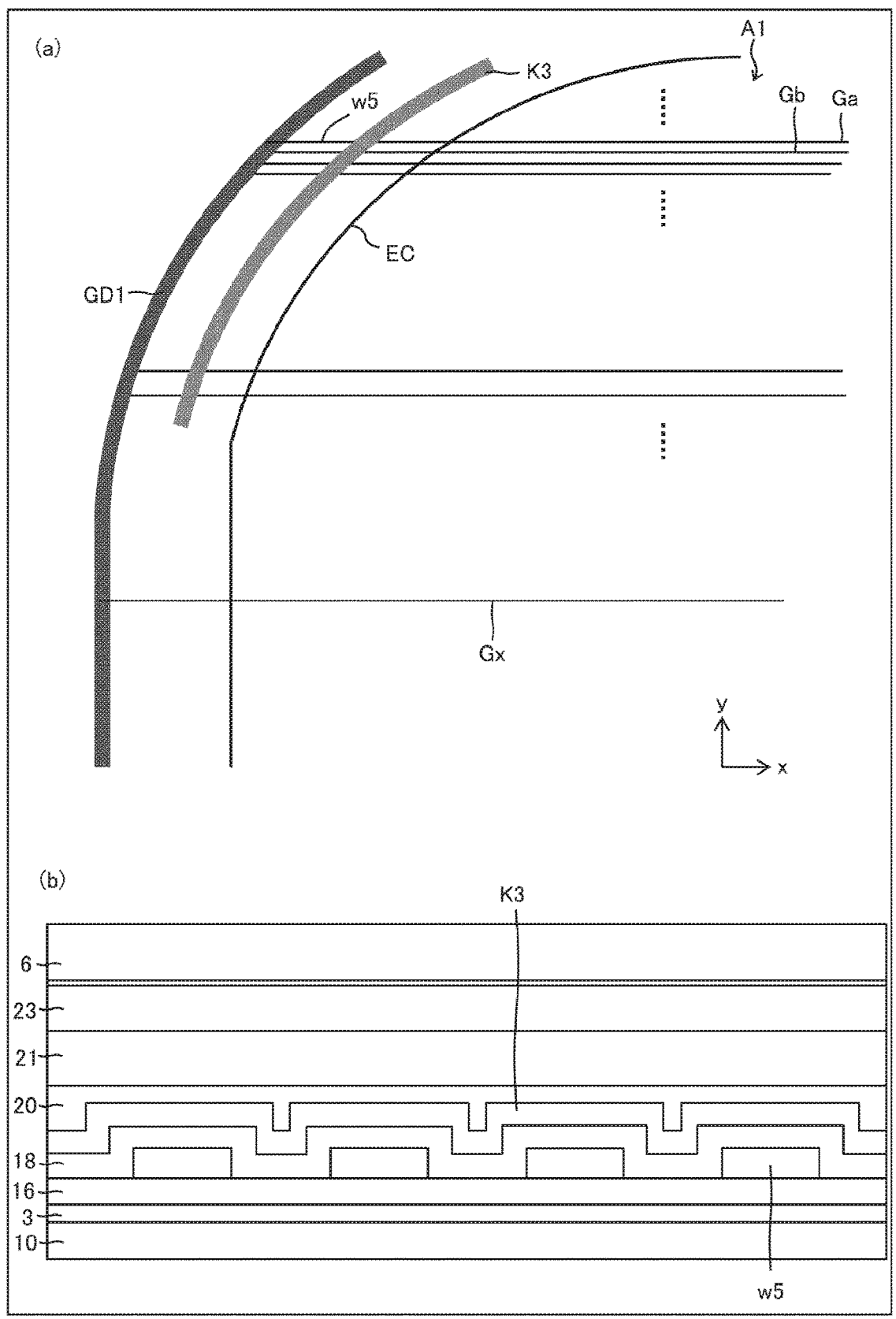
FIG. 11 is a plan view of an example configuration around a round corner of the display region.

FIG. 10 is a plan view of the configuration of a display device according to a second embodiment. FIG. 11 is a plan view of an example configuration around a round corner of the display device.

As illustrated in FIGS. 10 and 11, the display device according to the second embodiment includes the gate driver GD1 having a curved end. The display device also includes the conductive film K3 disposed in a gap between the gate driver GD1 and a corner edge EC (the edge of the region A1) so as to be bent along the corner edge EC in plan view. The display device also includes the routed wire w5 connected to the scan signal line Ga and routed from the corner edge EC to the frame region NA. The routed wire w5 (included in the first metal layer) and the conductive film K3 (included in the second metal layer) overlap each other via the inorganic insulating film 18.

The display device also includes the gate driver GD2 having a curved end. The display device also includes the conductive film K4 disposed in a gap between the gate driver GD2 and a corner edge (the edge of the region A2) so as to be bent along the corner edge in plan view. The display device also includes the routed wire w6 connected to the scan signal line GA and routed from the corner edge EC to the frame region NA. The routed wire w6 (included in the first metal layer) and the conductive film K4 (included in the second metal layer) overlap each other via the inorganic insulating film 18.

The above configuration enables a capacitance between the routed wire w5 and the conductive film K3 to be added to the routed wire w5, which extends from the scan signal line Ga to the frame region, and enables a capacitance between the routed wire w6 and the conductive film K4 to be added to the routed wire w6, which extends from the scan signal line GA. The scan signal lines Ga and GA consequently have a drive load coincident with a drive load of the scan signal line Gx.

Third Embodiment

Figure 12:
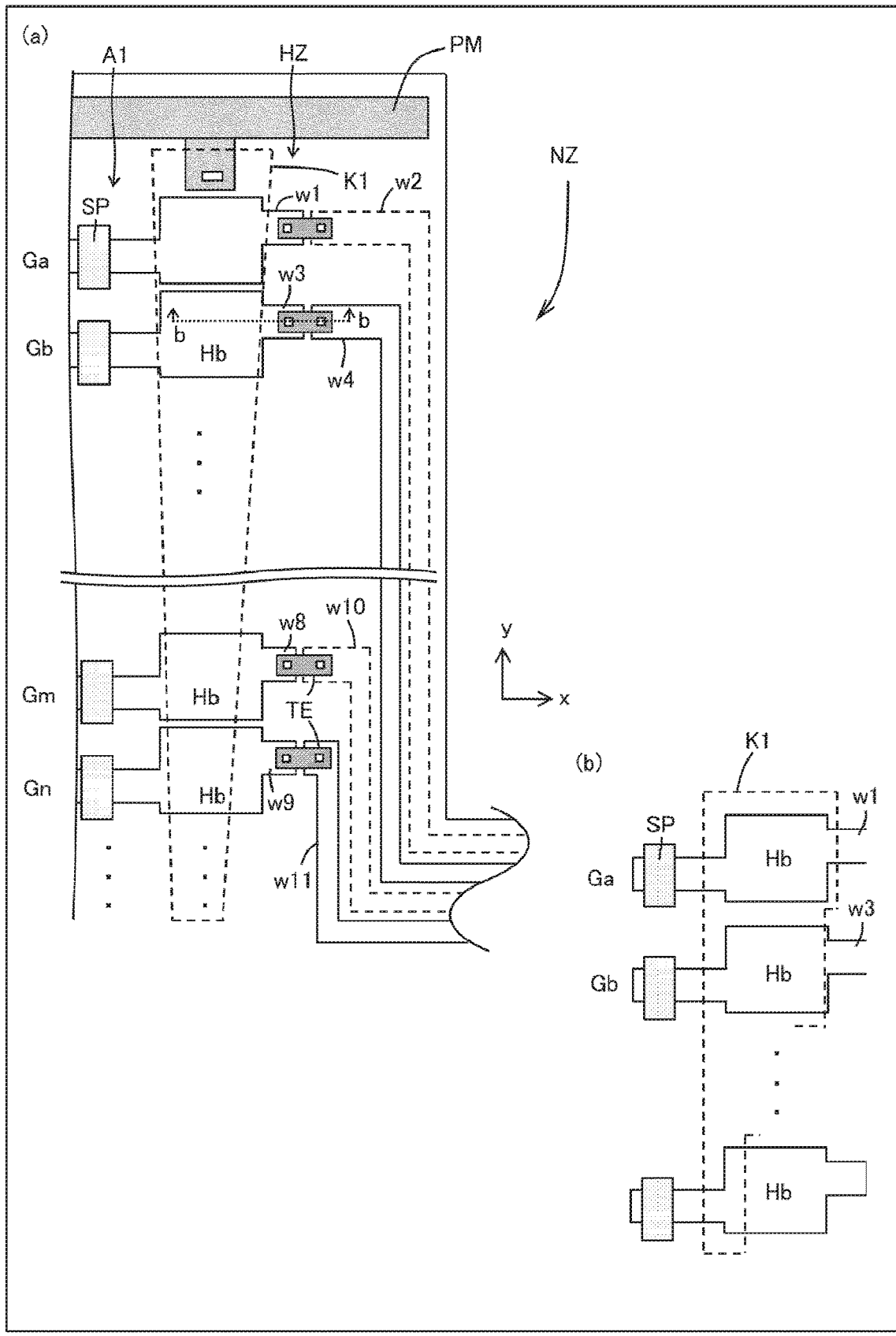
FIG. 12 is a plan view of the configuration of a display device according to a third embodiment.

FIG. 12 is a plan view of the configuration of a display device according to a third embodiment. The display device in FIG. 12 includes the routed wire w8 (wide portion Hb) extending from a scan signal line Gm toward the nick NZ, and the routed wire w9 (wide portion Hb) extending from a scan signal line Gn toward the nick NZ. The routed wires w8 and w9 overlap the conductive film K1. The routed wire w8 is closer to the middle of the display region than the routed wire w is. In this embodiment, sub-pixel circuits (connected to the scan signal lines Gm and GM) electrically connected to the routed wire w8 outnumbers sub-pixel circuits (connected to the scan signal lines Ga and GA) electrically connected to the routed wire w1, as illustrated in FIG. 3. The display device is accordingly configured such that the overlap between the routed wire w8 and the conductive film K1 is smaller in area than the overlap between the routed wire w1 and the conductive film K1, and is configured such that the routed wire w8 receives a smaller additional capacitance than the routed wire w1. This configuration eliminates brightness unevenness (gradation) in the first region A1. FIG. 12 illustrates that part of the region A1, which is on the left side of the notch NZ in FIG. 3, has more sub-pixel circuits with approach to the middle of the display region. That is, the number of sub-pixel circuits increases along with approach from the upper end, where the nick is disposed, to the middle of the display region in accordance with design around the round corner of the display region. The number of sub-pixel circuits changes (not shown) according to the nick shape, such as a curved shape and a slanted shape.

The conductive film K1 may have any shape other than the shape illustrated in FIG. 12(a), which is a trapezoidal shape whose width decreases along with approach to the middle of the display region. The conductive film K1 may have a staircase shape, as shown in FIG. 12(b), so that occurrence of patterning discrepancy between the first and second metal layers, if any, does not cause a capacitance difference.

Fourth Embodiment

Figure 13:
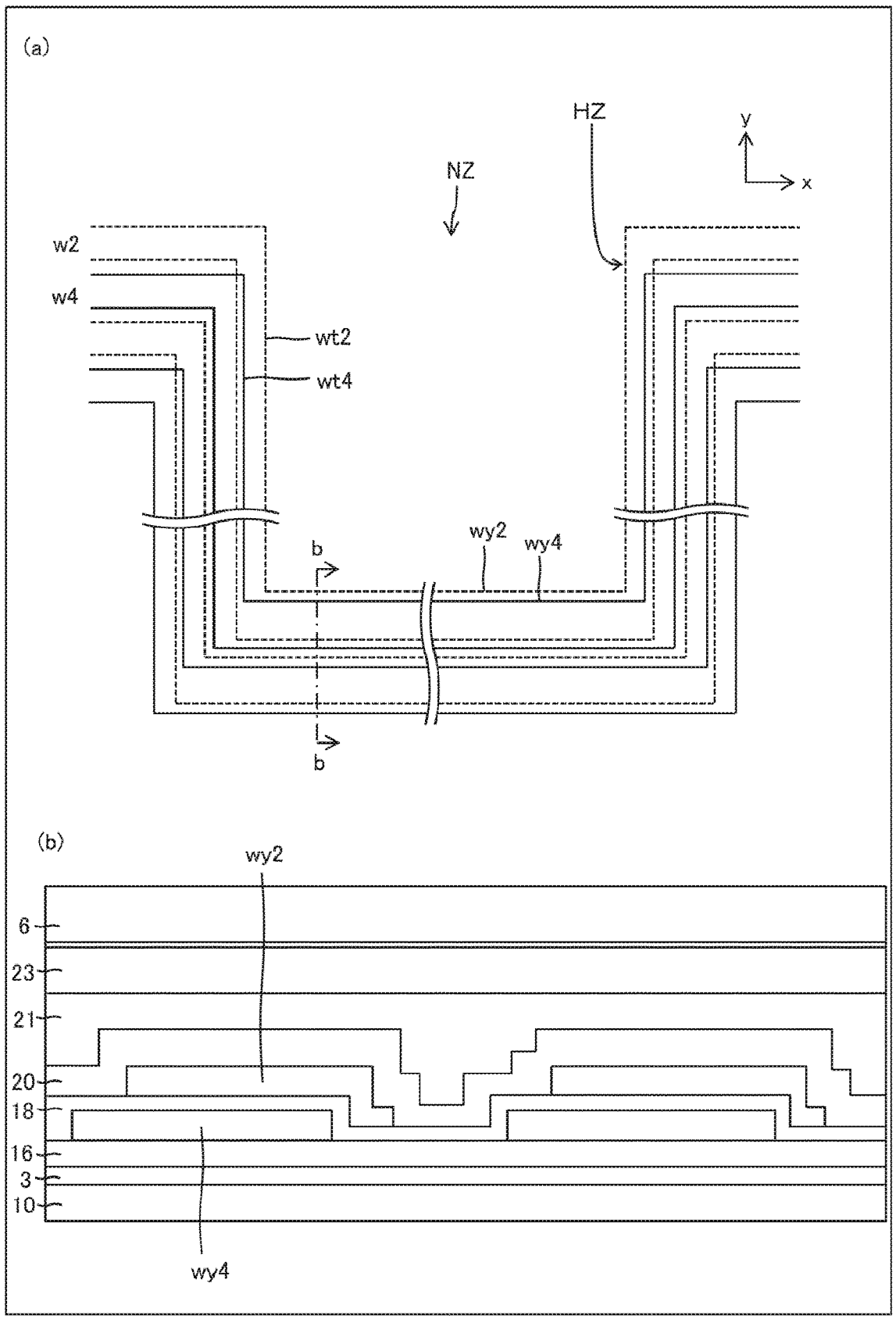
FIG. 13(a) is a plan view of the configuration of a display device according to a fourth embodiment.
FIG. 13(b) is a cross-sectional view taken along line b-b in FIG. 13(a).

FIG. 13(a) is a plan view of the configuration of a display device according to a fourth embodiment. FIG. 13(b) is a cross-sectional view taken along line b-b in FIG. 13(a). As illustrated in FIG. 13, the display device can be configured such that the routed wire w2 (included in the second metal layer), connected to the routed wire w1 and routed around the nick NZ, and the routed wire w4 (included in the first metal layer), connected to the routed wire w3 and routed around the nick NZ, overlap each other via the inorganic insulating film 18. For instance, the display device can be configured such that a laterally extending portion wy2 of the routed wire w2 and a laterally extending portion wy4 of the routed wire w4 overlap each other, and such that a longitudinally extending portion wt2 of the routed wire w2 and a longitudinally extending portion wt4 of the routed wire w4 overlap each other.

Such a configuration enables a capacitance to be mutually added to the routed wire w2, electrically connected to the scan signal line Ga, and to the routed wire w4, electrically connected to the scan signal line Gb. The scan signal lines Ga and GA and the scan signal lines Gb and GB consequently have their drive loads coincident with a drive load of the scan signal line Gx.

Figure 14:
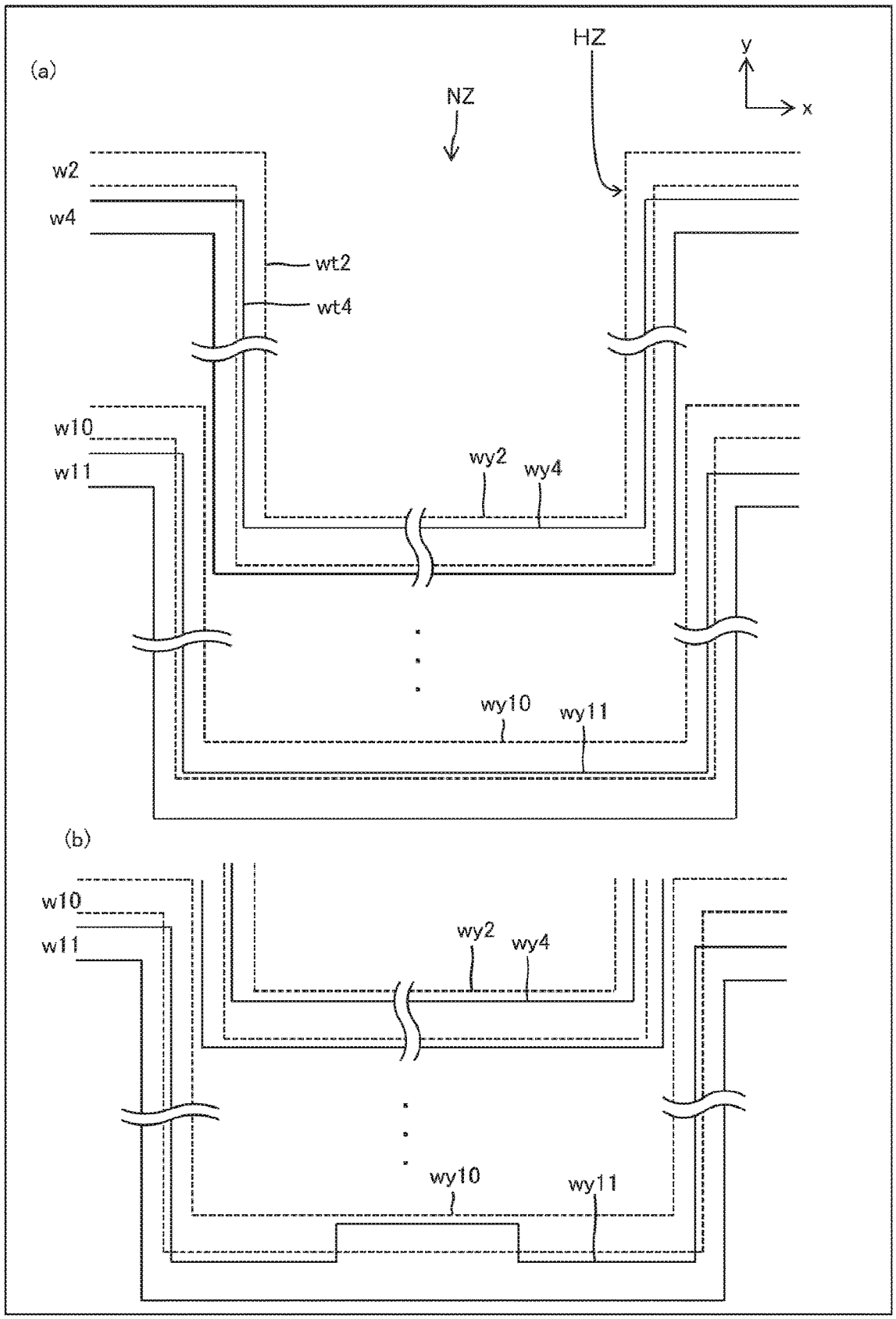
FIG. 14(a) and FIG. 14(b) are plan views of the configuration of a display device according to a fourth embodiment.

FIG. 14 is a plan view of the configuration of the display device according to the fourth embodiment. The display device in FIG. 14 includes the routed wire w10 (included in the second metal layer) electrically connected to the routed wire w8 (extending from the scan signal line Gm) and routed around the nick NZ. The display device also includes the routed wire w11 (included in the first metal layer) connected to the routed wire w9 (extending from the scan signal line Gn, which is adjacent to the scan signal line Gm) and routed around the nick NZ. The display device may be configured such that the routed wires w10 and w11 may overlap each other via the inorganic insulating film 18. The routed wire w8 is closer to the middle of the display region than the routed wire w1 is.

As illustrated in FIG. 3, sub-pixel circuits (connected to the scan signal lines Gm and GM) electrically connected to the routed wire w10 outnumbers sub-pixel circuits (connected to the scan signal lines Ga and GA) electrically connected to the routed wire w2. The display device is accordingly configured such that the overlap between the routed wires w10 and w11 is smaller in area than the overlap between the routed wires w2 and w4. This configuration eliminates brightness unevenness (gradation) in the first region A1.

FIG. 14(a) illustrates that the overlap between a laterally extending portion wy10 of the routed wire w10 and a laterally extending portion wy11 of the routed wire w11 has a smaller width than the overlap between the laterally extending portion wy2 of the routed wire w2 and the laterally extending portion wy4 of the routed wire w4. FIG. 14(b) illustrates that the overlap between the laterally extending portion wy10 of the routed wire w10 and the laterally extending portion wy11 of the routed wire w11 has a smaller length than the overlap between the laterally extending portion wy2 of the routed wire w2 and the laterally extending portion wy4 of the routed wire w4.

Fifth Embodiment

Figure 15:
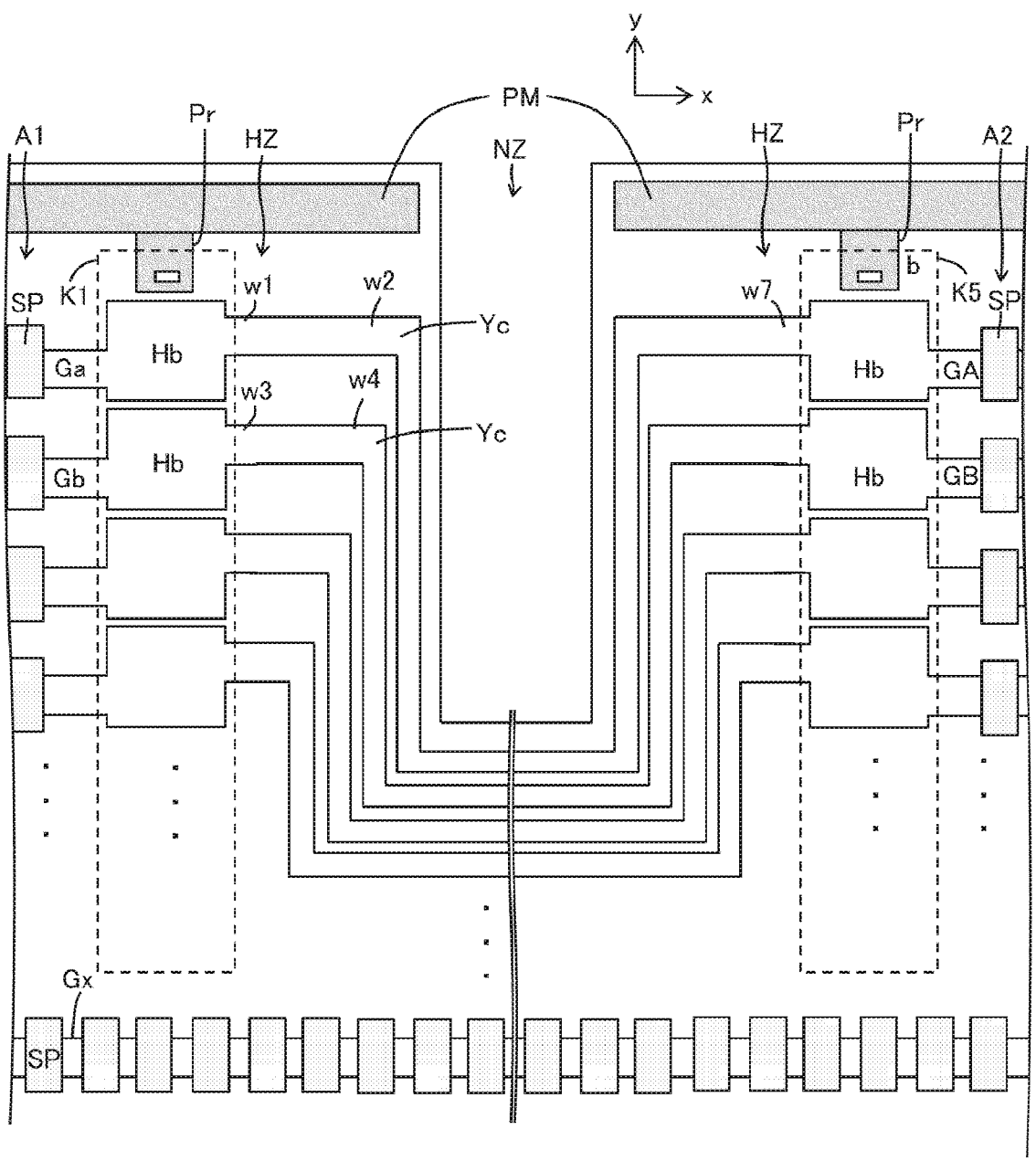
FIG. 15 is a plan view of the configuration of a display device according to a fifth embodiment.

FIG. 15 is a plan view of the configuration of a display device according to a fifth embodiment. The first to fourth embodiments have described, by way of example only, that the routed wire w1 is disposed in the first metal layer, the routed wire w2, in the second metal layer; and the routed wire w7, in the first metal layer. As illustrated in FIG. 15, the routed wires w1, w2, and w7 may be disposed in the first metal layer, in addition, the scan signal line Ga, the routed wires w1, w2, and w7, and the scan signal line GA may be connected together (integrated) in the same layer.

Sixth Embodiment

Figure 16:
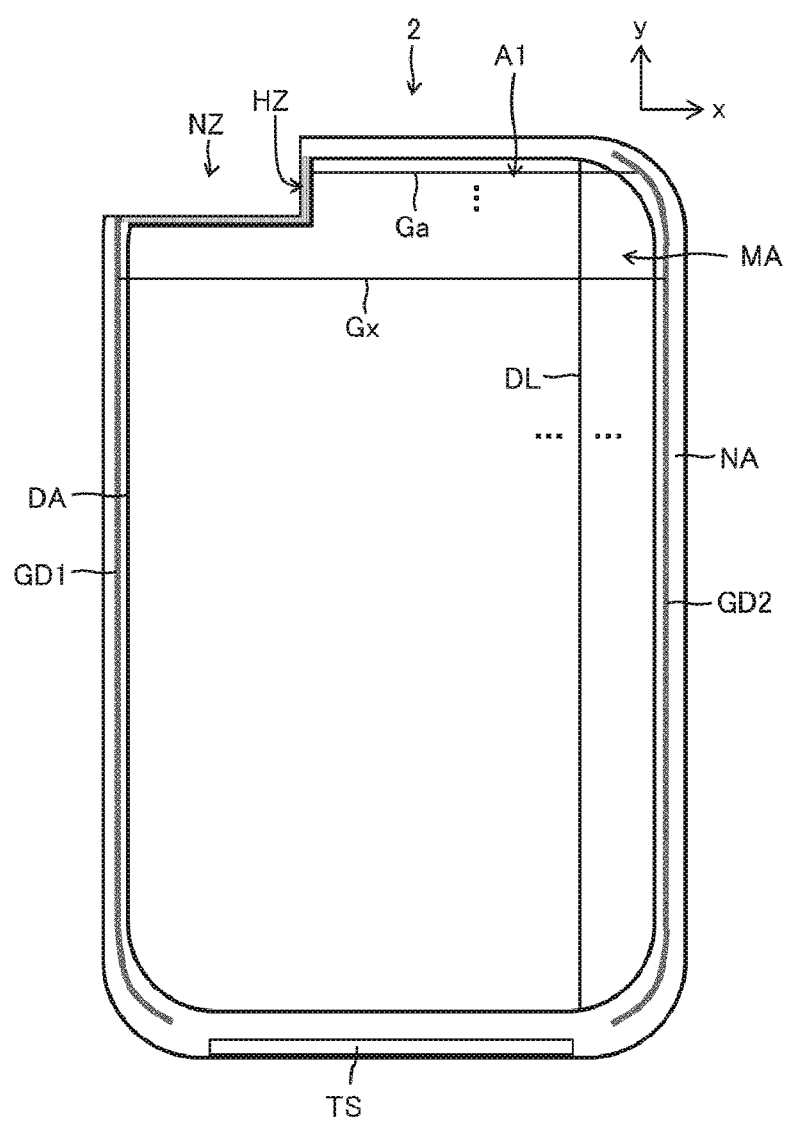
FIG. 16 is a plan view of the configuration of a display device according to a sixth embodiment.
Figure 17:
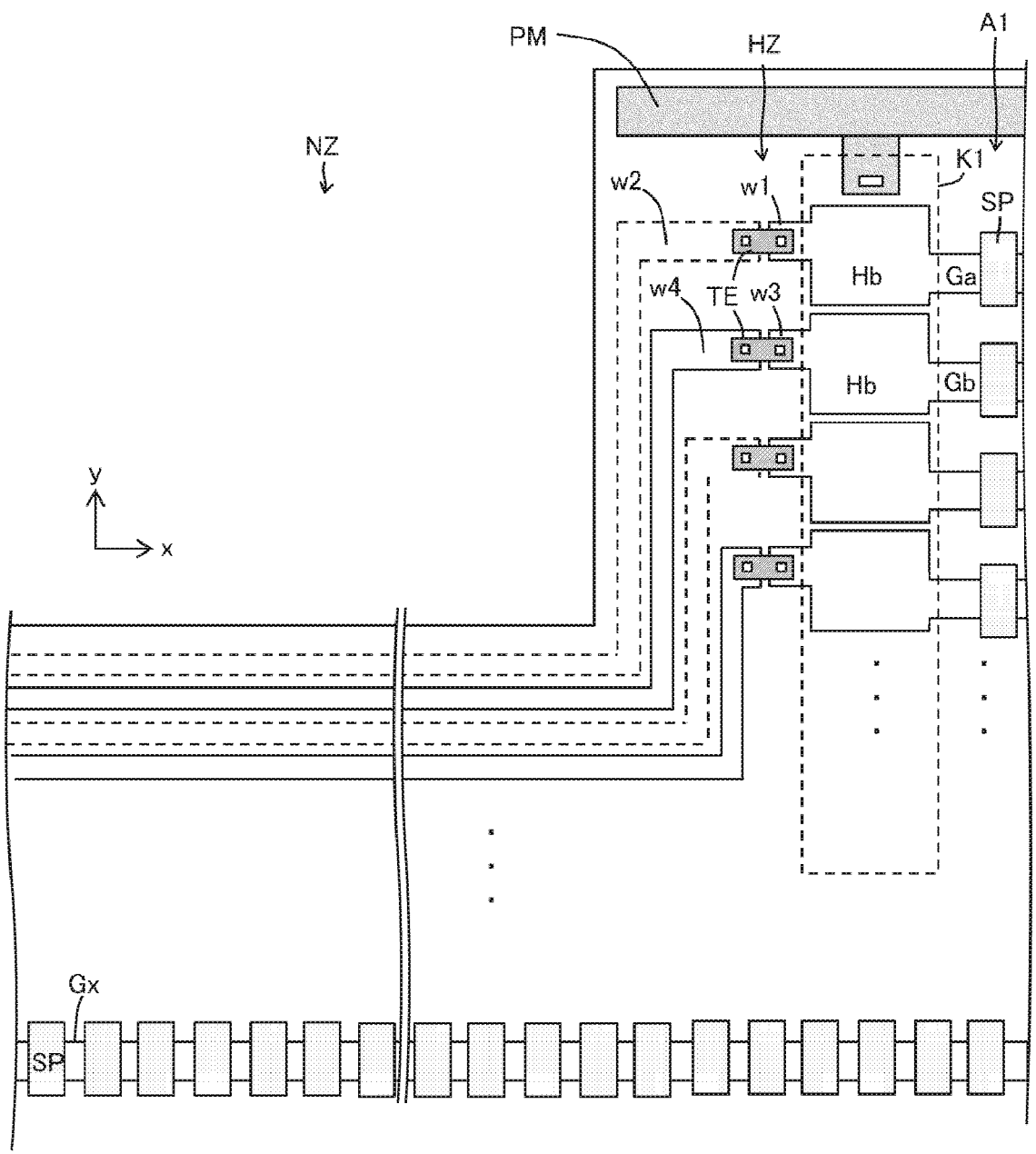
FIG. 17 is a plan view of the configuration around the nick in the display region.

FIG. 16 is a plan view of the configuration of a display device according to a sixth embodiment. FIG. 17 is a plan view of an example configuration around the nick in the display region. The first to fifth embodiments have described, by way of example only, that the nick NZ is disposed between two corners in parallel in the shorter-side direction of the display device (the x-direction, i.e., the direction where the scan signal lines extend). In some embodiments, the nick NZ can be disposed at one of the two corners in parallel in the shorter-side direction, as illustrated in FIG. 16.

The display device in FIGS. 16 and 17 includes the routed wires w1 and w3 (included in the first metal layer) routed from the first region A1 toward the nick NZ, and the conductive film K1 (included in the second metal layer) disposed in a gap between the first region A1 and the nick NZ in the non-display zone HZ, which is the perimeter of the first region A1. The display device is configured such that the routed wires w1 and w3 and the conductive film K1 overlap each other via the inorganic insulating film 18. This configuration enables a capacitance between the routed wire w1 and the conductive film K1 to be added to the routed wire w1, which extends from the scan signal line Ga.

Sub-pixels connected to the scan signal line Ga are fewer than sub-pixels connected to the scan signal line Gx, which passes through the main region MA. Hence, for the gate drivers GD1 and GD2, a drive load of the scan signal line Ga is smaller than a drive load of the scan signal line Gx. Capacitance addition to the routed wire w1, which extends from the scan signal line Ga, thus can reduce the difference between the drive load of the scan signal line Gx and the drive load of the scan signal lines Ga.

The foregoing has described, by way of example only, that the routed wires (w1 to w11) is provided for establishing electrical connection between the scan signal lines and for establishing electrical connection with the gate drivers that drive these lines. In some embodiments, the routed wires can be provided for establishing electrical connection between the light-emission control lines and for establishing electrical connection with the emission drivers that drive these lines.

SUMMARY

The display device according to each of the foregoing embodiments may include any electro-optical element (an electro-optical element whose brightness and transmittance are regulated by current). Examples of the display device according to each embodiment include the following: an organic electro-luminescence (EL) display having organic light-emitting diodes (OLEDs), which are electro-optical elements; an inorganic EL display having inorganic light-emitting diodes, which are electro-optical elements; and a QLED display having quantum-dot light-emitting diodes (QLEDs), which are electro-optical elements.

First Aspect

A display device includes a display region and a display region disposed around the display region. The display region includes a nick provided so as to partly cut the display region. The display region includes the following: a plurality of data signal lines that transmit a data signal; a plurality of scan signal lines intersecting with the plurality of data signal lines; a plurality of light-emission control lines; and a plurality of sub-pixel circuits provided so as to correspond to points of intersection between the plurality of data signal lines and the plurality of scan signal lines. The display device also includes the following: a drive circuit electrically connected to the plurality of data signal lines; a drive circuit electrically connected to the plurality of scan signal lines; and a drive circuit electrically connected to the plurality of light-emission control lines. The frame region on the periphery of the nick includes a first routed wire electrically connected to one of the plurality of scan signal lines, one of the plurality of light-emission control lines, or one of the plurality of data signal lines. The first routed wire extends from the display region toward the nick. The first routed wire is included in a first metal layer. The display device also includes a first conductive film included in a second metal layer. The first routed wire and the first conductive film overlap each other via an inorganic insulating film.

Second Aspect

The display device according, for instance, to the first aspect is configured such that the first routed wire has a wide portion widening the first routed wire locally. The display device is also configured such that the first conductive film overlaps the wide portion.

Third Aspect

The display device according, for instance, to the second aspect is configured such that the first conductive film overlaps the wide portion in whole.

Fourth Aspect

The display device according, for instance, to any one of the first to third aspects includes a second routed wire electrically connected to the first routed wire and routed around the nick. The second routed wire has a bend in a gap between the display region and the nick. The display device is configured such that the first conductive film is disposed between the bend and the display region in plan view.

Fifth Aspect

The display device according, for instance, to the fourth aspect includes a third routed wire adjacent to the first routed wire, and a fourth routed wire electrically connected to the third routed wire and routed around the nick. The display device is configured such that the fourth routed wire has a bend in a gap between the display region and the nick. The display device is also configured such that the first routed wire is electrically connected to the second routed wire via a connection electrode included in a third metal layer. The display device is also configured such that the third routed wire is electrically connected to the fourth routed wire via the connection electrode included in the third metal layer. The display device is also configured such that the second routed wire is included in the second metal layer, and such that the fourth routed wire is included in the first metal layer.

Sixth Aspect

The display device according, for instance, to any one of the first to fifth aspects is configured such that the first routed wire is electrically connected to the drive circuit via any one of the plurality of scan signal lines included in the first metal layer.

Seventh Aspect

The display device according, for instance, to any one of the first to sixth aspects is configured such that the first conductive film is a fixed-potential wire.

Eighth Aspect

The display device according, for instance, to any of the first to sixth aspects is configured such that the first conductive film is electrically floating.

Ninth Aspect

The display device according, for instance, to any one of the first to seventh aspects is configured such that the first conductive film is electrically connected to a wire that supplies a power-source voltage to the plurality of sub-pixel circuits, or is electrically connected to a lower-layer electrode or upper-layer electrode of a light-emitting element included in each of the plurality of sub-pixel circuits.

Tenth Aspect

The display device according, for instance, to any one of the first to ninth aspects is configured such that each of the plurality of sub-pixel circuits includes a capacitor electrode, and such that the capacitor electrode is included in the second metal layer.

Eleventh Aspect

The display device according, for instance, to any one of the first to tenth aspects is configured such that the first conductive film extends across the first routed wire.

Twelfth Aspect

The display device according, for instance, to any one of the first to eleventh aspects includes a third routed wire included in the first metal layer and adjacent to the first routed wire. The display device is configured such that the third routed wire and the first conductive film overlap each other via the inorganic insulating film.

Thirteenth Aspect

The display device according, for instance, to the eighth aspect includes a third routed wire included in the first metal layer and adjacent to the first routed wire, and includes a second conductive film. The display device is configured such that the third routed wire and the second conductive film overlap each other via the inorganic insulating film. The display device is also configured such that the second conductive film is electrically floating and is electrically isolated from the first conductive film adjacent to the second conductive film.

Fourteenth Aspect

The display device according, for instance, to the eighth aspect includes a third routed wire adjacent to the first routed wire, and a second conductive film. The display device is configured such that the third routed wire and the second conductive film overlap each other via the inorganic insulating film. The display device is also configured such that the second conductive film is electrically connected to the first conductive film adjacent to the second conductive film. The display device is also configured such that the first and second conductive films are electrically floating.

Fifteenth Aspect

The display device according, for instance, to any one of the first to fourteenth aspects includes the following: a stack of, in sequence, the first metal layer, the inorganic insulating film, the second metal layer, a different inorganic insulating film, and a third metal layer; a third routed wire included in the first metal layer and adjacent to the first routed wire, and a second conductive film adjacent to the first conductive film. The display device is configured such that the third routed wire and the second conductive film overlap each other via the inorganic insulating film. The display device is also configured such that the first and second conductive films are electrically connected together via the third metal layer. The first and second conductive films each have an island-shape.

Sixteenth Aspect

The display device according, for instance, to the fifteenth aspect is configured such that the first conductive film is made of the same material as an anode or cathode of a light-emitting element included in each of the plurality of sub-pixel circuits, or is made of the same material as the plurality of data signal lines. The display device is also configured such that the first conductive film is disposed in the same layer as the anode or the cathode, or is disposed in the same layer as the plurality of data signal lines.

Seventeenth Aspect

The display device according, for instance, to the fifteenth aspect is configured such that in the frame region, the first and second conductive films overlap an upper-layer electrode of a light-emitting element included in each of the plurality of sub-pixel circuits.

Eighteenth Aspect

The display device according, for instance, to any one of the first to seventeenth aspects is configured such that on the outside of the display region, the first routed wire and the first conductive film overlap each other via the inorganic insulating film. The outside is located in a gap between the display region and the nick.

Nineteenth Aspect

The display device according, for instance, to the third aspect is configured such that the wide portion has an elongated shape larger in the direction of extension than in the direction of width.

Twentieth Aspect

The display device according, for instance, to any one of the first to nineteenth aspects is configured such that the display region includes first and second regions facing each other with the nick interposed between the first and second regions. The display device includes a fifth routed wire electrically connected to the first routed wire and routed from the edge of the first region to the frame region. The display device is configured such that outside the edge of the first region, the fifth routed wire overlaps a third conductive film via the inorganic insulating film.

Twenty-First Aspect

The display device according, for instance, to any one of the twentieth aspect includes a sixth routed wire electrically connected to the first routed wire and routed from the edge of the second region to the frame region. The display device is configured such that outside the edge of the second region, the sixth routed wire overlaps a fourth conductive film via the inorganic insulating film.

Twenty-Second Aspect

The display device according, for instance, to any one of the first to twenty-first aspects is configured such that the display region includes first and second regions facing each other with the nick interposed between the first and second regions. The display device includes the following: a second routed wire electrically connected to the first routed wire and routed around the nick; and a seventh routed wire electrically connected to the first routed wire via the second routed wire. The display device is configured such that in a gap between the first region and the nick, the first routed wire overlaps the first conductive film via the inorganic insulating film. The display device is also configured such that in a gap between the second region and the nick, the seventh routed wire overlaps a fifth conductive film via the inorganic insulating film. Herein, the fifth conductive film is included in the second metal layer.

Twenty-Third Aspect

The display device according, for instance, to the twenty-second aspect is configured such that the second routed wire is disposed in the second metal layer, and such that the seventh routed wire is disposed in the first metal layer.

Twenty-Fourth Aspect

The display device according, for instance, to the twenty-second aspect is configured such that the second and seventh routed wires are disposed in the first metal layer.

Twenty-Fifth Aspect

The display device according, for instance, to any one of the first to twenty-fourth aspects includes an eighth routed wire closer to the middle of the display region than the first routed wire is. The display device is configured such that in a gap between the display region and the nick, the first and eighth routed wires overlap the first conductive film via the inorganic insulating film. The display device is also configured such that the overlap between the eighth routed wire and the first conductive film and the overlap between the first routed wire and the first conductive film have different sizes in area.

Twenty-Sixth Aspect

The display device according, for instance, to the twenty-fifth aspect is configured such that the overlap between the eighth routed wire and the first conductive film is smaller in area than the overlap between the first routed wire and the first conductive film. The display device is also configured such that the plurality of sub-pixel circuits electrically connected to the eighth routed wire outnumbers the plurality of sub-pixel circuits electrically connected to the first routed wire.

Twenty-Seventh Aspect

The display device according, for instance, to any one of the first to twenty-sixth aspects includes the following: a second routed wire electrically connected to the first routed wire and routed around the nick; a third routed wire adjacent to the first routed wire; and a fourth routed wire electrically connected to the third routed wire and routed around the nick. The display device is configured such that the second and fourth routed wires overlap each other via the inorganic insulating film.

Twenty-Eighth Aspect

The display device according, for instance, to the twenty-seventh aspect includes the following: eighth and ninth routed wires closer to the middle of the display region than the first routed wire is; a tenth routed wire electrically connected to the eighth routed wire and routed around the nick; and an eleventh routed wire connected to the ninth routed wire and routed around the nick. The display device is configured such that the tenth and eleventh routed wires overlap each other via the inorganic insulating film.

Twenty-Ninth Aspect

The display device according, for instance, to the twenty-eighth aspect is configured such that the overlap between the second and fourth routed wires and the overlap between the tenth and eleventh routed wires have different sizes in area.

Thirtieth Aspect

The display device according, for instance, to the twenty-ninth aspect is configured such that the overlap between the second and fourth routed wires and the overlap between the tenth and eleventh routed wires have different widths.

Thirty-First Aspect

The display device according, for instance, to the twenty-ninth aspect is configured such that the overlap between the second and fourth routed wires and the overlap between the tenth and eleventh routed wires have different lengths.

Thirty-Second Aspect

The display device according, for instance, to the twenty-ninth aspect is configured such that the plurality of sub-pixel circuits electrically connected to the second routed wire and the plurality of sub-pixel circuits electrically connected to the tenth routed wire are different in number.

Thirty-Third Aspect

The display device according, for instance, to the thirty-second aspect is configured such that the overlap between the tenth and eleventh routed wires is smaller in area than the overlap between the second and fourth routed wires. The display device is also configured such that the plurality of sub-pixel circuits electrically connected to the tenth routed wire outnumbers the plurality of sub-pixel circuits electrically connected to the second routed wire.

Thirty-Fourth Aspect

The display device according, for instance, to any one of the first to thirty-third aspects is configured such that the frame region includes a terminal, and such that the display region is partly disposed between the terminal and the nick.

The invention claimed is:

1. A display device comprising:
a display region including a nick provided so as to partly cut the display region, as a notch recessed from an outer edge of the display region in a plan view; and
a frame region disposed around the display region along the outer edge of the display region in the plan view,
the display region further including:
a plurality of data signal lines configured to transmit a data signal,
a plurality of scan signal lines intersecting with the plurality of data signal lines,
a plurality of light-emission control lines, and
a plurality of sub-pixel circuits provided so as to correspond to points of intersection between the plurality of data signal lines and the plurality of scan signal lines,
the display device further comprising:
a source driver electrically connected to the plurality of data signal lines;
a gate driver electrically connected to the plurality of scan signal lines; and
an emission driver electrically connected to the plurality of light-emission control lines,
the frame region on a periphery of the nick including
a first routed wire electrically connected to one of the plurality of scan signal lines, one of the plurality of light-emission control lines, or one of the plurality of data signal lines, the first routed wire extending from the display region toward the nick, the first routed wire being included in a first metal layer,
the display device further comprising
a first conductive film being a part of a second metal layer, wherein
the first routed wire and the first conductive film overlap each other via an inorganic insulating film.

2. A display device comprising:
a display region including a nick provided so as to partly cut the display region, as a notch recessed from an outer edge of the display region in a plan view; and
a frame region disposed around the display region along the outer edge of the display region in the plan view,
the display region further including:
a plurality of data signal lines configured to transmit a data signal,
a plurality of scan signal lines intersecting with the plurality of data signal lines,
a plurality of light-emission control lines, and
a plurality of sub-pixel circuits provided so as to correspond to points of intersection between the plurality of data signal lines and the plurality of scan signal lines,
the display device further comprising:
a source driver electrically connected to the plurality of data signal lines;
a gate driver electrically connected to the plurality of scan signal lines; and
an emission driver electrically connected to the plurality of light-emission control lines, the frame region on a periphery of the nick including
a first routed wire electrically connected to one of the plurality of scan signal lines, one of the plurality of light-emission control lines, or one of the plurality of data signal lines, the first routed wire extending from the display region toward the nick, the first routed wire being included in a first metal layer,
the display device further comprising
a first conductive film being a part of a second metal layer, wherein
the first routed wire and the first conductive film overlap each other via an inorganic insulating film,
a second routed wire electrically connected to the first routed wire and routed around the nick, the second routed wire having a first bend in the frame region in the plan view, and
the first conductive film is disposed between the first bend and the display region in the plan view.

3. The display device according to claim 2, further comprising:
a third routed wire adjacent to the first routed wire; and
a fourth routed wire electrically connected to the third routed wire and routed around the nick,
wherein the fourth routed wire has a second bend in the frame region in the plan view,
the first routed wire is electrically connected to the second routed wire via a connection electrode included in a third metal layer,
the third routed wire is electrically connected to the fourth routed wire via the connection electrode included in the third metal layer,
the second routed wire is included in the second metal layer, and
the fourth routed wire is included in the first metal layer.

4. The display device according to claim 1, wherein the first routed wire is electrically connected, via any one of the plurality of scan signal lines included in the first metal layer, to the gate driver.

5. A display device comprising:
a display region including a nick provided so as to partly cut the display region, as a notch recessed from an outer edge of the display region in a plan view; and
a frame region disposed around the display region along the outer edge of the display region in the plan view,
the display region further including:
a plurality of data signal lines configured to transmit a data signal,
a plurality of scan signal lines intersecting with the plurality of data signal lines,
a plurality of light-emission control lines, and
a plurality of sub-pixel circuits provided so as to correspond to points of intersection between the plurality of data signal lines and the plurality of scan signal lines,
the display device further comprising:
a source driver electrically connected to the plurality of data signal lines;
a gate driver electrically connected to the plurality of scan signal lines; and
an emission driver electrically connected to the plurality of light-emission control lines,
the frame region on a periphery of the nick including
a first routed wire electrically connected to one of the plurality of scan signal lines, one of the plurality of light-emission control lines, or one of the plurality of data signal lines, the first routed wire extending from the display region toward the nick, the first routed wire being included in a first metal layer,
the display device further comprising:
a first conductive film being a part of a second metal layer, wherein the first routed wire and the first conductive film overlap each other via an inorganic insulating film;
a stack of, in sequence, the first metal layer, the inorganic insulating film, the second metal layer, a different inorganic insulating film, and a third metal layer;
a third routed wire included in the first metal layer and adjacent to the first routed wire; and
a second conductive film adjacent to the first conductive film,
wherein the third routed wire and the second conductive film overlap each other via the inorganic insulating film, and
the first and second conductive films are electrically connected together via the third metal layer, the first and second conductive films each having an island-shape.

6. The display device according to claim 5, wherein
the first conductive film is made of the same material as an anode or a cathode of a light-emitting element included in each of the plurality of sub-pixel circuits, or is made of the same material as the plurality of data signal lines, and
the first conductive film is disposed in the same layer as the anode or the cathode, or is disposed in the same layer as the plurality of data signal lines.

7. The display device according to claim 5, wherein in the frame region, the first and second conductive films overlap an upper-layer electrode of a light-emitting element included in each of the plurality of sub-pixel circuits.

8. The display device according to claim 1, wherein on an outside of the display region, the first routed wire and the first conductive film overlap each other via the inorganic insulating film, the outside being located in the frame region in the plan view.

9. The display device according to claim 1, wherein
the display region includes first and second regions facing each other with the nick interposed between the first and second regions,
the display device comprises:
a fifth routed wire electrically connected to the first routed wire and routed from an edge of the first region to the frame region, and
outside the edge of the first region, the fifth routed wire overlaps a third conductive film via the inorganic insulating film.

10. The display device according to claim 9, further comprising:
a sixth routed wire electrically connected to the first routed wire and routed from an edge of the second region to the frame region,
wherein outside the edge of the second region, the sixth routed wire overlaps a fourth conductive film via the inorganic insulating film.

11. The display device according to claim 1, wherein
the display region includes first and second regions facing each other with the nick interposed between the first and second regions,
the display device comprises:
a second routed wire electrically connected to the first routed wire and routed around the nick; and a seventh routed wire electrically connected to the first routed wire via the second routed wire, in the frame region in the plan view, the first routed wire overlaps the first conductive film via the inorganic insulating film, and in the frame region in the plan view, the seventh routed wire overlaps a fifth conductive film via the inorganic insulating film, the fifth conductive film being a part of the second metal layer.

12. The display device according to claim 11, wherein the second routed wire is disposed in the second metal layer, and the seventh routed wire is disposed in the first metal layer.

13. The display device according to claim 11, wherein the second and seventh routed wires are disposed in the first metal layer.

14. The display device according to claim 1, further comprising:

an eighth routed wire closer to a middle of the display region than the first routed wire is, wherein in the frame region in the plan view, the first and eighth routed wires overlap the first conductive film via the inorganic insulating film, and an overlap between the eighth routed wire and the first conductive film and an overlap between the first routed wire and the first conductive film have different sizes in area.

15. The display device according to claim 14, wherein the overlap between the eighth routed wire and the first conductive film is smaller in area than the overlap between the first routed wire and the first conductive film, and the plurality of sub-pixel circuits electrically connected to the eighth routed wire outnumbers the plurality of sub-pixel circuits electrically connected to the first routed wire.

16. The display device according to claim 1, further comprising:

a second routed wire electrically connected to the first routed wire and routed around the nick;

a third routed wire adjacent to the first routed wire; and a fourth routed wire electrically connected to the third routed wire and routed around the nick, wherein the second and fourth routed wires overlap each other via the inorganic insulating film.

17. The display device according to claim 16, further comprising:

eighth and ninth routed wires closer to a middle of the display region than the first routed wire is;

a tenth routed wire electrically connected to the eighth routed wire and routed around the nick; and an eleventh routed wire connected to the ninth routed wire and routed around the nick, wherein the tenth and eleventh routed wires overlap each other via the inorganic insulating film.

18. The display device according to claim 17, wherein an overlap between the second and fourth routed wires and an overlap between the tenth and eleventh routed wires have different sizes in area.

19. The display device according to claim 18, wherein the plurality of sub-pixel circuits electrically connected to the second routed wire and the plurality of sub-pixel circuits electrically connected to the tenth routed wire are different in number.

20. The display device according to claim 19, wherein the overlap between the tenth and eleventh routed wires is smaller in area than the overlap between the second and fourth routed wires, and the plurality of sub-pixel circuits electrically connected to the tenth routed wire outnumbers the plurality of sub-pixel circuits electrically connected to the second routed wire.

* * * * *